US010261422B2

(12) United States Patent
Van Den Nieuwelaar et al.

(10) Patent No.: US 10,261,422 B2
(45) Date of Patent: Apr. 16, 2019

(54) LITHOGRAPHY APPARATUS AND METHOD OF MANUFACTURING A DEVICE

(71) Applicant: ASML Netherlands B.V., Veldhoven (NL)

(72) Inventors: Norbertus Josephus Martinus Van Den Nieuwelaar, Tilburg (NL); Victor Manuel Blanco Carballo, Eindhoven (NL); Casper Roderik De Groot, Eindhoven (NL); Rolf Hendrikus Jacobus Custers, Eindhoven (NL); David Merritt Phillips, Hillsboro, OR (US); Frederik Antonius Van Der Zanden, Eindhoven (NL); Pieter Lein Joseph Gunter, Weert (NL); Erik Henricus Egidius Catharina Eummelen, Eindhoven (NL); Yuri Johannes Gabriël Van De Vijver, Best (NL); Bert Dirk Scholten, Best (NL); Marijn Wouters, Eindhoven (NL); Ronald Frank Kox, Peer (NL); Jorge Alberto Vieyra Salas, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 130 days.

(21) Appl. No.: 15/500,866

(22) PCT Filed: Jun. 30, 2015

(86) PCT No.: PCT/EP2015/064793
§ 371 (c)(1),
(2) Date: Jan. 31, 2017

(87) PCT Pub. No.: WO2016/020121
PCT Pub. Date: Feb. 11, 2016

(65) Prior Publication Data
US 2017/0219933 A1 Aug. 3, 2017

Related U.S. Application Data

(60) Provisional application No. 62/146,762, filed on Apr. 13, 2015, provisional application No. 62/034,644, filed on Aug. 7, 2014.

(51) Int. Cl.
G03F 7/20 (2006.01)
G02B 27/00 (2006.01)

(52) U.S. Cl.
CPC ..... G03F 7/70341 (2013.01); G02B 27/0043 (2013.01); G03F 7/2043 (2013.01);
(Continued)

(58) Field of Classification Search
CPC .............. G02B 27/0043; G03F 7/2043; G03F 7/70341; G03F 7/70358; G03F 7/70725; G03F 7/70858; G03F 7/70925
See application file for complete search history.

(56) References Cited

U.S. PATENT DOCUMENTS 6,952,253 B2   10/2005   Lof et al.
7,423,725 B2    9/2008   Zaal et al.
(Continued)

FOREIGN PATENT DOCUMENTS

CN   101361024   2/2009
CN   103282931   9/2013
(Continued)

OTHER PUBLICATIONS

Japanese Office Action dated Feb. 28, 2018 in corresponding Japanese Patent Application No. 2017-506749.
(Continued)

Primary Examiner — Steven Whitesell Gordon
(74) Attorney, Agent, or Firm — Pillsbury Winthrop Shaw Pittman LLP

(57) ABSTRACT

An immersion lithography apparatus has a controller configured to control a substrate table to move along an expo-
(Continued)

sure route including in order: an entry motion in which the substrate moves from an off-substrate position at which the immersion space does not overlap the substrate to an on-substrate position at which the immersion space at least partially overlaps the substrate, a transfer motion in which the substrate table changes speed and/or direction and moves for at least a transfer time after the substrate moves to the on-substrate position, and an expose motion in which the substrate is scanned and the patterned beam is projected onto the substrate, wherein throughout the transfer motion at least a part of the immersion space overlaps the substrate and wherein the patterned beam is not projected onto the substrate during the entry motion and the transfer motion.

20 Claims, 15 Drawing Sheets

(52) U.S. Cl.
CPC ...... *G03F 7/70725* (2013.01); *G03F 7/70358* (2013.01); *G03F 7/70858* (2013.01); *G03F 7/70925* (2013.01)

(56) References Cited

U.S. PATENT DOCUMENTS

| | | | |
|---|---|---|---|
| 7,656,501 | B2 | 2/2010 | Ten Kate et al. |
| 8,405,817 | B2 | 3/2013 | Stavenga et al. |
| 8,634,053 | B2 | 1/2014 | Riepen et al. |
| 8,755,025 | B2 | 6/2014 | Tanno et al. |
| 9,329,491 | B2 | 5/2016 | Grouwstra et al. |
| 2004/0207824 | A1 | 10/2004 | Lof et al. |
| 2005/0243292 | A1* | 11/2005 | Baselmans .......... G03F 7/70341 355/53 |
| 2007/0052940 | A1 | 3/2007 | Zaal et al. |
| 2007/0109512 | A1 | 5/2007 | Ten Kate et al. |
| 2008/0079919 | A1* | 4/2008 | Ito .......................... G03B 27/42 355/53 |
| 2008/0212046 | A1 | 9/2008 | Riepen et al. |
| 2009/0066922 | A1 | 3/2009 | Nakano |
| 2010/0045949 | A1 | 2/2010 | Nakano et al. |
| 2010/0214543 | A1* | 8/2010 | Stavenga ............ G03F 7/70341 355/30 |
| 2010/0259759 | A1 | 10/2010 | Goldberg et al. |
| 2012/0003381 | A1 | 1/2012 | Grouwstra et al. |
| 2012/0069309 | A1 | 3/2012 | Willems et al. |
| 2012/0162619 | A1* | 6/2012 | Sato .................... G03F 7/70216 355/27 |

FOREIGN PATENT DOCUMENTS

| | | |
|---|---|---|
| EP | 1 420 298 | 5/2004 |
| EP | 1 482 372 | 12/2004 |
| EP | 2 221 669 | 8/2010 |
| JP | 2008-042027 | 2/2008 |
| JP | 2009-289896 | 12/2009 |
| JP | 2013-235922 | 11/2013 |
| JP | 2014-503980 | 2/2014 |

OTHER PUBLICATIONS

International Search Report and Written Opinion dated Dec. 18, 2015 in corresponding International Patent Application No. PCT/EP2015/064793.

* cited by examiner

LITHOGRAPHY APPARATUS AND METHOD OF MANUFACTURING A DEVICE

CROSS-REFERENCE TO RELATED APPLICATIONS

This application is the U.S. national phase entry of PCT patent application no. PCT/EP2015/064793, which was filed on Jun. 30, 2015, which claims the benefit of priority of U.S. provisional application No. 62/034,644, which was filed on Aug. 7, 2014, and U.S. provisional application No. 62/146,762, which was filed on Apr. 13, 2015, which are incorporated herein in their entireties by reference.

FIELD

The present invention relates to a lithography apparatus, a method of manufacturing a device using a lithography apparatus, and a control program for a lithography apparatus.

BACKGROUND

A lithography apparatus is a machine that applies a desired pattern onto a substrate, usually onto a target portion of the substrate. A lithography apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithography apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti parallel to this direction.

In an immersion lithography apparatus, a liquid is confined to an immersion space by a liquid confinement structure. The immersion space is between a final optical element of a projection system through which the pattern is imaged and the substrate onto which the pattern is transferred or a substrate table on which the substrate is held. The liquid may be confined to the immersion space by a fluid seal. The liquid confinement structure may create or use a flow of gas, for example to help in controlling the flow and/or the position of the liquid in the immersion space. The flow of gas may form the seal to confine the liquid to the immersion space.

SUMMARY

Defects in the pattern applied to the substrate are undesirable as they reduce the yield, i.e. the number of usable devices per substrate. Since many patterning steps are required to make a device, even a very low rate of defects per exposure can significantly reduce the yield. There are two types of defect that are peculiar to an immersion lithography apparatus.

A droplet of liquid or a liquid film (hereinafter reference to a droplet also encompasses a film; a film being a droplet covering a larger surface area) from the immersion space may be left on the substrate after exposure of a target portion. If the droplet is in contact with the resist for a significant period it can degrade the resist. If the droplet evaporates, it can leave behind debris. Defects resulting from droplets left on the substrate, whether by resist degradation or evaporation, are referred to herein as trail defects.

A second form of defect peculiar to an immersion lithography apparatus occurs if a bubble is formed in the immersion liquid. If the bubble moves into the path of a projection beam used to project the image of the patterning device onto the substrate, then the projected image will be distorted. Defects caused by bubbles are referred to herein as expose defects.

It is desirable, for example, to provide a system to reduce the effects of defects peculiar to an immersion lithography apparatus.

According to an aspect, there is provided an immersion lithography apparatus comprising: a substrate table configured to support a substrate having a plurality of target portions; a projection system configured to project a patterned beam onto the substrate; a positioner configured to move the substrate table relative to the projection system; a liquid confinement structure configured to confine a liquid to an immersion space between the projection system and a surface of the substrate and/or the substrate table; and a controller configured to control the positioner to move the substrate table to follow an exposure route, the exposure route comprising in order: an entry motion in which the substrate table moves from an off-substrate position at which the immersion space does not overlap the substrate to an on-substrate position at which the immersion space at least partially overlaps the substrate, a transfer motion in which the substrate table changes speed and/or direction and moves for at least a certain transfer time after the substrate moves to the on-substrate position, and an expose motion in which the substrate is scanned and the patterned beam is projected onto the substrate, wherein the patterned beam is not projected onto the substrate during the entry motion and the transfer motion, and wherein throughout the transfer motion at least a part of the immersion space overlaps the substrate.

According to an aspect, there is provided an immersion lithography apparatus comprising: a substrate table configured to support a substrate having a plurality of target portions; a projection system configured to project a patterned beam onto the substrate; a positioner configured to move the substrate table relative to the projection system; a liquid confinement structure configured to confine a liquid to an immersion space between the projection system and a surface of the substrate and/or the substrate table; and a controller configured to control the positioner to move the substrate table to follow an exposure route, the exposure route comprising: a first motion in which the substrate table moves in a first direction, a second motion in which the substrate table moves in a second direction, the second direction being substantially perpendicular to the first direction, a cleaning motion in which the substrate table continues to move in a third direction until an edge of the substrate passes a leading edge of the immersion space, and a return motion in which the substrate table moves in a fourth direction, the fourth direction being at least partly opposite to the third direction, the cleaning and the return motion being performed between the first motion and the second motion.

According to an aspect, there is provided a device manufacturing method using an immersion lithography apparatus to project a patterned beam onto a substrate having a plurality of target portions, the method comprising: confining a liquid to an immersion space between a projection system and a facing surface; and moving a substrate table holding the substrate along an exposure route, the exposure route comprising in order: an entry motion in which the substrate moves from an off-substrate position at which the immersion space does not overlap the substrate to an on-substrate position at which the immersion space at least partially overlaps the substrate, a transfer motion in which the substrate table changes speed and/or direction and moves for at least a certain transfer time after the substrate moves to the on-substrate position, and an expose motion in which the substrate is scanned and the projection beam is projected onto the substrate, wherein the patterned beam is not projected onto the substrate during the entry motion and the transfer motion, and wherein throughout the transfer motion at least a part of the immersion space overlaps the substrate.

According to an aspect, there is provided a device manufacturing method using an immersion lithography apparatus to project a patterned beam onto a substrate having a plurality of target portions, the method comprising: confining a liquid to an immersion space between a projection system and a facing surface; and moving a substrate table holding the substrate along an exposure route, the exposure route comprising in order: a first motion in which the substrate table moves in a first direction, a second motion in which the substrate table moves in a second direction, the second direction being substantially perpendicular to the first direction, a cleaning motion in which the substrate table continues to move in a third direction until an edge of the substrate passes a leading edge of the immersion space, and a return motion in which the substrate table moves in a fourth direction, the fourth direction being at least partly opposite to the third direction, the cleaning and the return motion being performed between the first motion and the second motion.

According to an aspect, there is provided a control program for an immersion lithography apparatus that projects a patterned beam through a liquid confined to an immersion space onto a substrate having a plurality of target portions, the control program comprising code to control a positioner to move a substrate table holding the substrate along an exposure route, the exposure route comprising in order: an entry motion in which the substrate moves from an off-substrate position at which the immersion space does not overlap the substrate to an on-substrate position at which the immersion space at least partially overlaps the substrate, a transfer motion in which the substrate table changes speed and/or direction and moves for at least a certain transfer time after the substrate moves to the on-substrate position, and an expose motion in which the substrate is scanned and the patterned beam is projected onto the substrate, wherein the patterned beam is not projected onto the substrate during the entry motion and the transfer motion, and wherein throughout the transfer motion at least a part of the immersion space overlaps the substrate.

According to an aspect, there is provided a control program for an immersion lithography apparatus that projects a patterned beam through a liquid confined to an immersion space onto a substrate having a plurality of target portions, the control program comprising code to control a positioner to move a substrate table holding the substrate along an exposure route, the exposure route comprising in order: a first motion in which the substrate table moves in a first direction, a second motion in which the substrate table moves in a second direction, the second direction being substantially perpendicular to the first direction, a cleaning motion in which the substrate table continues to move in a third direction until an edge of the substrate passes a leading edge of the immersion space, and a return motion in which the substrate table moves in a fourth direction, the fourth direction being at least partly opposite to the third direction, the cleaning and the return motion being performed between the first motion and the second motion.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
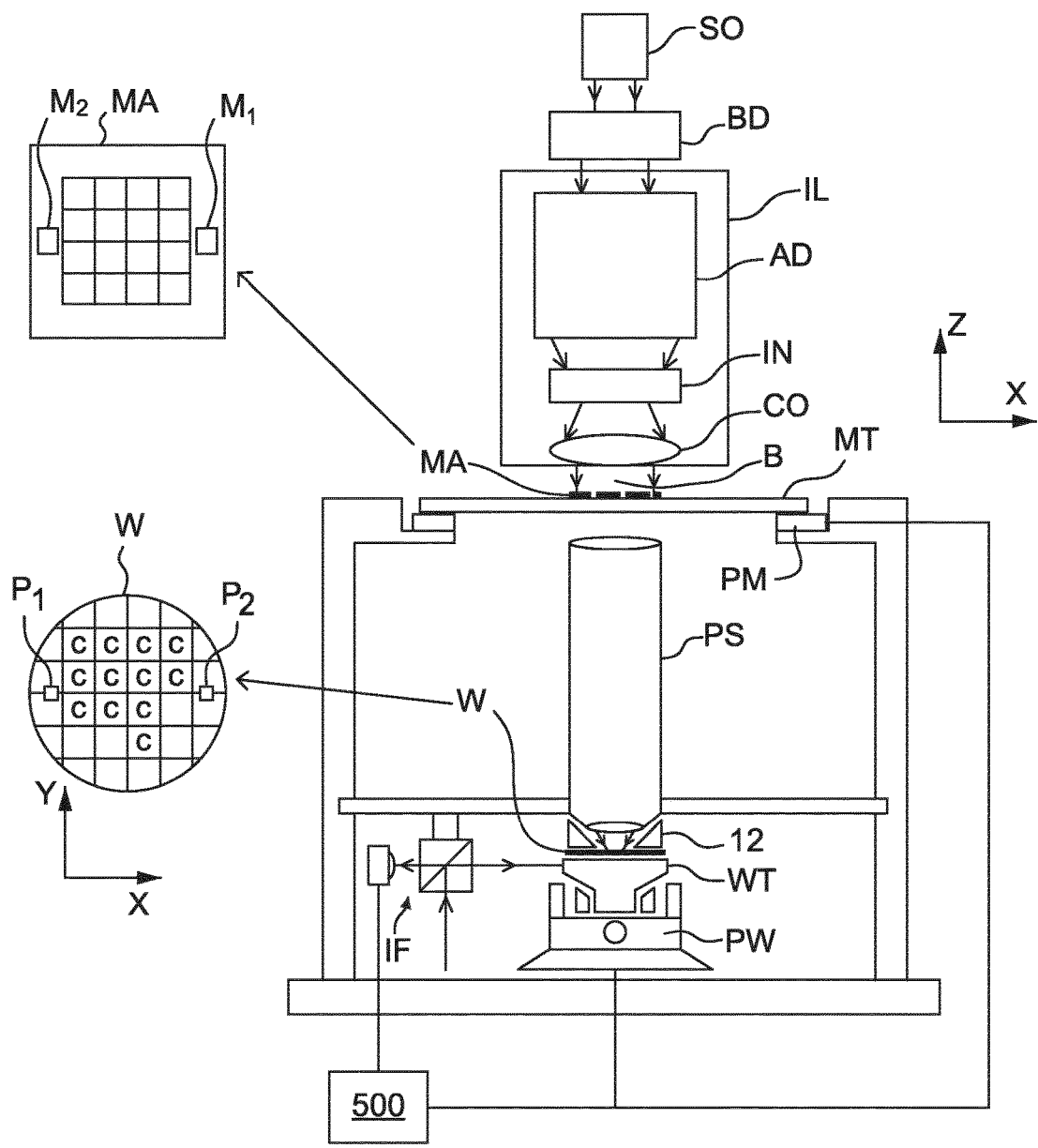
FIG. 1 schematically depicts a lithography apparatus.

FIG. 1 schematically depicts a lithography apparatus according to one embodiment of the invention. The apparatus includes an illumination system (illuminator) ILL configured to condition a projection beam B (e.g. UV radiation or any other suitable radiation), a support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the projection beam B by patterning device MA onto a target portion C (e.g. including one or more dies) of the substrate W.

The illumination system IL may include various types of optical components, such as refractive components, reflective components, magnetic components, electromagnetic components, electrostatic components or other types of optical components, or any combination thereof, for directing, shaping, or controlling radiation.

The support structure MT supports, i.e. bears the weight of, the patterning device MA. It holds the patterning device MA in a manner that depends on the orientation of the patterning device MA, the design of the lithography apparatus, and other conditions, such as for example whether or not the patterning device MA is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion C of the substrate W. It should be noted that the pattern imparted to the projection beam B may not exactly correspond to the desired pattern in the target portion C of the substrate W, for example if the pattern includes phase-shifting features or so called assist features. Generally, the pattern imparted to the projection beam B will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithography apparatus may be of a type having two (dual stage) or more stages or tables. At least one of the tables has a substrate support that can hold a substrate. At least one of the tables may be a measurement table that is not configured to hold a substrate. In an embodiment two or more of the tables each have a substrate support. The lithography apparatus may have two or more patterning device tables or "mask supports". In such "multiple stages" machines the additional tables or supports may be used in parallel, or preparatory steps may be carried out on one or more tables or supports while one or more other tables or supports are being used for exposure.

The lithography apparatus is of a type wherein at least a portion of the substrate W may be covered by a liquid having a relatively high refractive index, e.g. water such as ultra pure water (UPW), so as to fill an immersion space between the projection system PS and the substrate W. An immersion liquid may also be applied to other spaces in the lithography apparatus, for example, between the patterning device MA and the projection system PS. Immersion techniques can be used to increase the numerical aperture of projection systems. The term "immersion" as used herein does not mean that a structure, such as a substrate W, must be submerged in liquid; rather "immersion" only means that a liquid is located between the projection system PS and the substrate W during exposure. The path of the patterned radiation beam from the projection system PS to the substrate W is entirely through liquid.

Referring to FIG. 1, the illuminator IL receives a radiation beam from a radiation source SO. The source and the lithography apparatus may be separate entities, for example when the source is an excimer laser. In such cases, the source is not considered to form part of the lithography apparatus. In arrangements where the source is separate from the lithography apparatus, the radiation beam is passed from the source SO to the illuminator IL with the aid of a beam delivery system BD including, for example, suitable directing mirrors and/or a beam expander. In other cases the source may be an integral part of the lithography apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section. Similar to the source SO, the illuminator IL may or may not be considered to form part of the lithography apparatus. For example, the illuminator IL may be an integral part of the lithography apparatus or may be a separate entity from the lithography apparatus. In the latter case, the lithography apparatus may be configured to allow the illuminator IL to be mounted thereon. Optionally, the illuminator IL is detachable and may be separately provided (for example, by the lithography apparatus manufacturer or another supplier).

The projection beam B is incident on the patterning device MA (e.g., mask), which is held on the support structure MT (e.g., mask table), and is patterned by the patterning device MA. The projection beam having been patterned by the patterning device may be referred to as a patterned beam. Having traversed the patterning device, the projection beam B passes through the projection system PS, which focuses the beam onto a target portion C of the substrate W. With the aid of the second positioning device PW and position sensor IF (e.g. an interferometric device, encoder or capacitive sensor), the substrate table WT can be moved accurately, e.g. so as to position different target portions C in the path of the projection beam B. Similarly, the first positioning device PM and another position sensor (which is not explicitly depicted in FIG. 1) can be used to accurately position the patterning device with respect to the path of the projection beam B, e.g. after mechanical retrieval from a mask library, or during a scan.

In general, movement of the support structure MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioning device PW. In the case of a stepper (as opposed to a scanner) the support structure MT may be connected to a short-stroke actuator only, or may be fixed.

The patterning device and substrate W may be aligned using patterning device alignment marks M1, M2 and substrate alignment marks P1, P2. Although the substrate alignment marks P1, P2 as illustrated occupy dedicated target portions, they may be located in spaces between target portions (these are known as scribe-lane alignment marks). Similarly, in situations in which more than one die is provided on the patterning device, the patterning device alignment marks may be located between the dies.

The lithographic apparatus further includes a lithographic apparatus control unit 500 which controls all the movements and measurements of the various actuators and sensors described. The lithographic apparatus control unit 500 also includes signal processing and data processing capacity to implement desired calculations relevant to the operation of the lithographic apparatus. In practice, the lithographic apparatus control unit 500 will be realized as a system of many sub-units, each handling the real-time data acquisition, processing and control of a subsystem or component within the lithographic apparatus. For example, one processing subsystem may be dedicated to servo control of the second positioning device PW. Separate units may handle different actuators, or different axes. Another sub-unit might be dedicated to the readout of the position sensor IF. Overall control of the lithographic apparatus may be controlled by a central processing unit. The central processing unit may communicate with the sub-units, with operators and with other apparatuses involved in the lithographic manufacturing process.

Arrangements for providing liquid between a final optical element of the projection system PS and the substrate can be classed into three general categories. These are the bath type arrangement, the so-called localized immersion systems and the all-wet immersion systems. An embodiment of the present invention relates particularly to the localized immersion systems.

Figure 2:
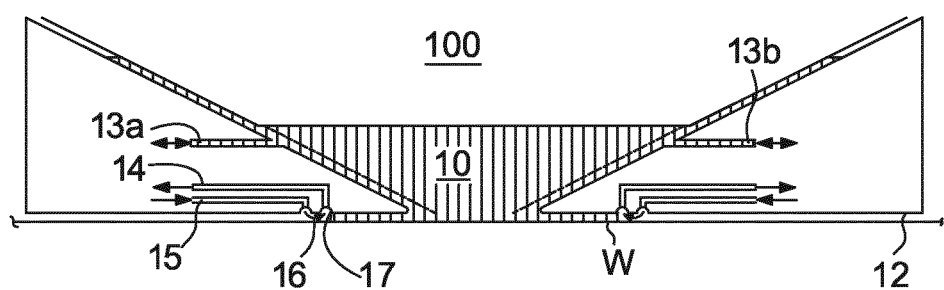
FIG. 2 schematically depicts a liquid confinement structure for use in a lithographic projection apparatus.

In an arrangement which has been proposed for a localized immersion system a liquid confinement structure 12 extends along at least a part of a boundary of an immersion space 10 between the final optical element 100 of the projection system PS and the facing surface of the stage or table facing the projection system PS. The facing surface of the table is referred to as such because the table is moved during use and is rarely stationary. Generally, the facing surface of the table is a surface of a substrate W, substrate table WT which surrounds the substrate W or both. Such an arrangement is illustrated in FIG. 2. The arrangement illustrated in FIG. 2 and described below may be applied to the lithography apparatus described above and illustrated in FIG. 1.

FIG. 2 schematically depicts the liquid confinement structure 12. The liquid confinement structure 12 extends along at least a part of a boundary of the immersion space 10 between the final optical element 100 of the projection system PS and the substrate table WT or substrate W. In an embodiment, a seal is formed between the liquid confinement structure 12 and the surface of the substrate W/substrate table WT. The seal may be a contactless seal such as a gas seal 16 (such a system with a gas seal is disclosed in European patent application publication no. EP-A-1,420,298) or a liquid seal.

The liquid confinement structure 12 is configured to supply and confine immersion liquid to the immersion space 10. Immersion liquid is brought into the immersion space 10 through one of liquid openings 13, e.g., opening 13a. The immersion liquid may be removed through one of liquid openings 13, e.g., opening 13b. The immersion liquid may be brought into the immersion space 10 through at least two liquid openings 13, e.g., opening 13a and opening 13b. Which of liquid openings 13 is used to supply immersion liquid and optionally which is used to remove immersion liquid may depend on the direction of motion of the substrate table WT.

Immersion liquid may be contained in the immersion space 10 by the gas seal 16 which, during use, is formed between the bottom of the liquid confinement structure 12 and the facing surface of the table (i.e. the surface of the substrate W and/or the surface of the substrate table WT). The gas in the gas seal 16 is provided under pressure via gas inlet 15 to a gap between the liquid confinement structure 12 and substrate W and/or substrate table WT. The gas is extracted via a channel associated with gas outlet 14. The overpressure on the gas inlet 15, vacuum level on the gas outlet 14 and geometry of the gap are arranged so that there is a high-velocity gas flow inwardly that confines the liquid. The force of the gas on the liquid between the liquid confinement structure 12 and the substrate W and/or substrate table WT contains the liquid in the immersion space 10. A meniscus 17 forms at a boundary of the immersion liquid. Such a system is disclosed in United States patent application publication no. US 2004-0207824. Other liquid confinement structures 12 can be used with embodiments of the present invention.

Figure 3:
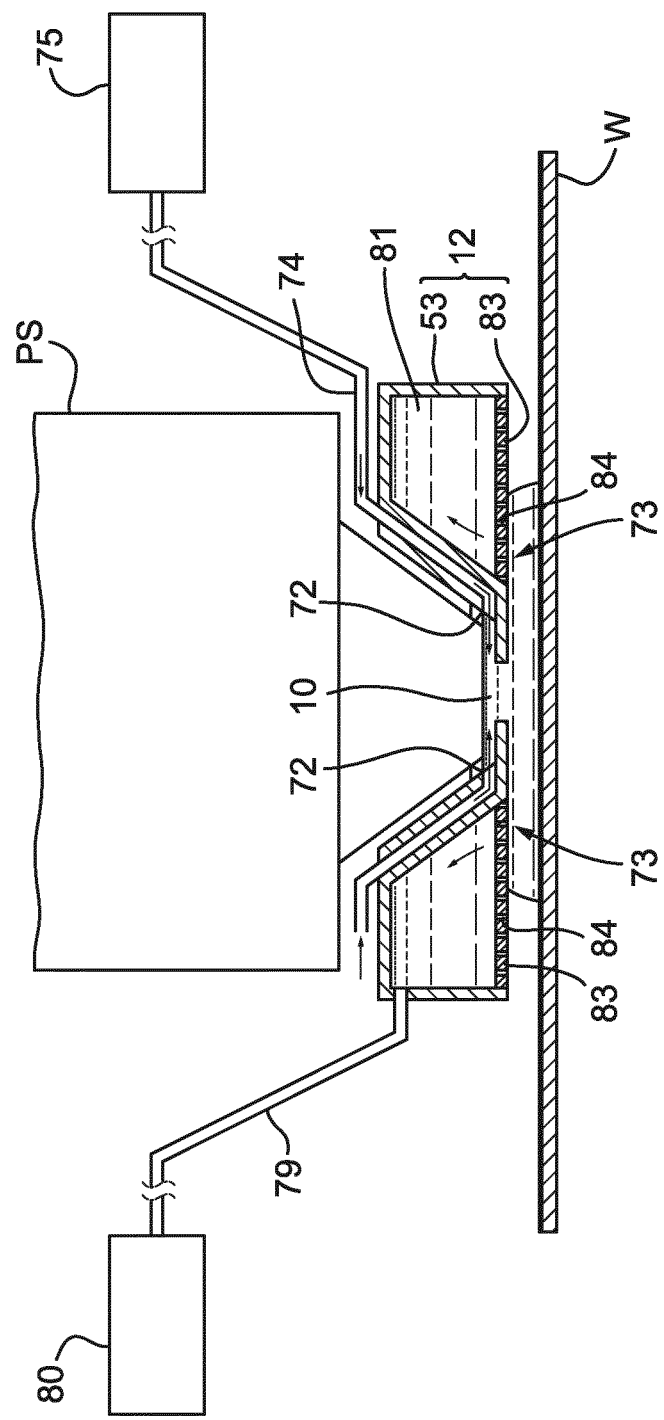
FIG. 3 is a side cross sectional view that schematically depicts a further liquid supply system according to an embodiment.

FIG. 3 is a side cross sectional view that depicts a further liquid supply system or fluid handling system according to an embodiment. The arrangement illustrated in FIG. 3 and described below may be applied to the lithographic apparatus LA described above and illustrated in FIG. 1. The liquid supply system is provided with a liquid confinement structure 12, which extends along at least a part of a boundary of the space between the final element of the projection system PS and the substrate table WT or substrate W. (Reference in the following text to surface of the substrate W also refers in addition or in the alternative to a surface of the substrate table WT, unless expressly stated otherwise.)

The liquid confinement structure 12 at least partly contains liquid in the immersion space 10 between the final element of the projection system PS and the substrate W and/or substrate table WT. The space 10 is at least partly formed by the liquid confinement structure 12 positioned below and surrounding the final element of the projection system PS. In an embodiment, the liquid confinement structure 12 comprises a main body member 53 and a porous member 83. The porous member 83 is plate shaped and has a plurality of holes 84 (i.e., openings or pores). In an embodiment, the porous member 83 is a mesh plate wherein numerous small holes 84 are formed in a mesh. Such a system is disclosed in United States patent application publication no. US 2010/0045949 A1.

The main body member 53 comprises one or more supply ports 72, which are capable of supplying the liquid to the immersion space 10, and a recovery port 73, which is capable of recovering the liquid from the immersion space 10. The one or more supply ports 72 are connected to a liquid supply apparatus 75 via a passageway 74. The liquid supply apparatus 75 is capable of supplying the liquid to the one or more supply ports 72. The liquid that is fed from the liquid supply apparatus 75 is supplied to the one or more supply ports 72 through the corresponding passageway 74. The one or more supply ports 72 are disposed in the vicinity of the optical path at a respective prescribed position of the main body member 53 that faces the optical path. The recovery port 73 is capable of recovering the liquid from the immersion space 10. The recovery port 73 is connected to a liquid recovery apparatus 80 via a passageway 79. The liquid recovery apparatus 80 comprises a vacuum system and is capable of recovering the liquid by sucking it via the recovery port 73. The liquid recovery apparatus 80 recovers the liquid recovered via the recovery port 73 through the passageway 79. The porous member 83 is disposed in the recovery port 73.

In an embodiment, to form the immersion space 10 with the liquid between the projection system PS and the liquid confinement structure 12 on one side and the substrate W on the other side, liquid is supplied from the one or more supply ports 72 to the immersion space 10 and the pressure in a recovery chamber 81 in the liquid confinement structure 12 is adjusted to a negative pressure so as to recover the liquid via the holes 84 (i.e., the recovery port 73) of the porous member 83. Performing the liquid supply operation using the one or more supply ports 72 and the liquid recovery operation using the porous member 83 forms the immersion space 10 between the projection system PS and the liquid confinement structure 12 and the substrate W.

In order to reduce or minimize the cost of ownership of a lithography apparatus, it is desirable to maximize throughput, that is the rate at which substrates are exposed, and yield, that is the proportion of exposed devices that function correctly. Since many exposure steps may be required to create a device, even a low rate of defects per exposure may result in a significant reduction of yield.

The frequency of occurrence of both trail defects and expose defects tends to increase as the speed of relative motion between the substrate table WT and the liquid confinement structure 12 increases. The speed of relative motion during a scanned exposure is referred to as the scan speed. An increase in the scan speed is desirable to increase throughput. An increase in scan speed may lead to an increase in defects because it is more difficult to effectively confine the immersion liquid to the immersion space 10. Trail defects and expose defects tend not to be randomly or uniformly distributed across the area of exposed substrates but occur with higher probability in certain locations. The distribution of trail defects and expose defects may vary according to the exposure recipe, in particular according to the order of exposure of target portions. To reduce the occurrence of defects, the scan speed may be reduced when exposing certain target portions of a substrate. However a reduction of scan speed is undesirable as it reduces throughput.

It should be noted that in a lithography apparatus it is normally the substrate table WT that moves while the projection system PS and liquid confinement structure 12 are stationary. However it is often convenient to describe motions of the substrate table WT as if the substrate table WT is stationary and the projection system PS and liquid confinement structure 12 move. An embodiment of the invention applies whether the substrate table WT and/or the projection system PS/liquid confinement structure 12 move.

The lithography apparatus may be provided with measures to prevent the formation of bubbles, to prevent bubbles straying into the path of the projection beam or to remove bubbles from the immersion space 10. Such measures may not be wholly effective. A bubble will in time be removed from the immersion space 10 or the gas within it may dissolve into the immersion liquid, but a bubble may still stray into the projection beam during an exposure and cause a defect. The defect may occur at an unpredictable location in any of the first few target portions that are exposed after formation of the bubble. It is therefore difficult to determine the cause of an expose defect; in particular it can be difficult to determine when a bubble that caused a particular expose defect was created.

To expose a series of target portions, an exposure route is typically calculated in advance. The exposure route includes scanning motions of the substrate table WT for each target portion to be exposed and transfer motions between scanning motions to line up the substrate table WT for the next scanning motion. Conventionally, each target portion in a column of target portions extending in a non-scan direction, e.g. the X direction, is exposed in turn. During the exposure, the substrate table moves in a scan direction, e.g. the +Y direction, which is substantially perpendicular to the non-scan direction, or a reverse scan direction, e.g. the −Y direction. Exposures in a sequence alternate between the scan direction and the reverse scan direction. The exposure motions and the transfer motions therefore together form a meander route. The exposure route may also include motions to perform measurements before, during, or after a sequence of exposures. During an exposure route, the substrate W may move completely out from underneath the liquid confinement structure 12 so that the immersion liquid does not overlap the substrate W. This occurs in particular when exposing an edge target portion. A movement of the substrate table WT to bring the substrate W underneath the immersion space 10, i.e. the movement during which the substrate edge crosses the meniscus 17 is referred to as an entry motion.

Edge target portions are target portions which intersect the substrate edge so that the target portion is not complete. When rectangular target portions are overlaid on a circular substrate it is inevitable that there will be some target portions that intersect the substrate edge and are incomplete. Edge target portions are conventionally exposed for two reasons. Firstly, if the pattern to be exposed includes a plurality of devices, i.e. the devices are smaller than the target portions, then it is possible that the edge target portion will include whole devices. Secondly, if the edge target portions are not exposed, a level difference between unexposed edge target portions and exposed non-edge target portions can arise through process steps such as etching or deposition. Such a level difference means that the target portions next to the unexposed edge target portions experience a different environment than target portions not next to the unexposed edge portions during process steps and so devices may not be formed correctly. Also, stresses can arise in the substrate.

In a conventional exposure route, the entry motion is performed in line with the expose motion of the first target portion to be exposed in order to maximize throughput. The substrate table WT can be accelerated to scan speed and correct positioning of the substrate table WT can be confirmed during the entry motion. An edge target portion may pass under the immersion space 10 during the entry motion, and then the adjacent non-edge target portion is exposed. The first few target portions exposed after an entry motion are more likely to experience defects and it has been proposed to expose such target portions at a lower scan speed than the remaining target portions.

Figure 4:
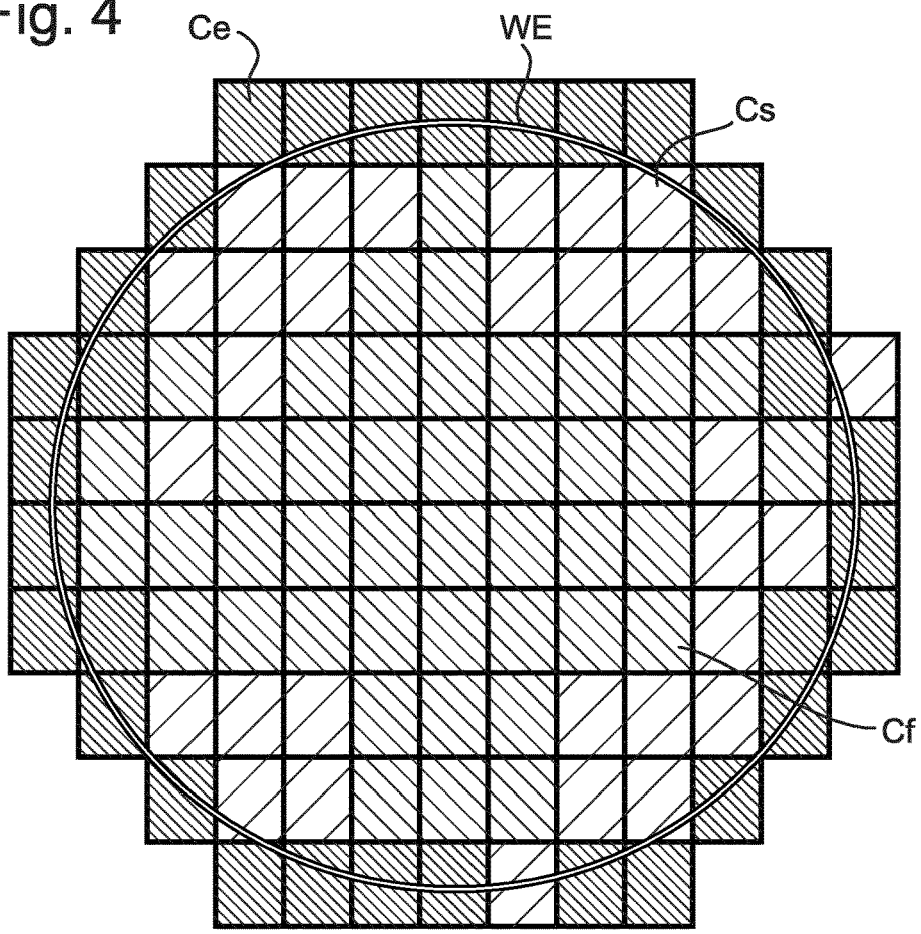
FIG. 4 schematically depicts an arrangement of target portions on a substrate and different scanning speeds applied.

FIG. 4 depicts an arrangement of 110 target portions overlaid on a substrate W. Other arrangements of target portions are possible. It will be seen that 42 target portions Ce intersect the substrate edge WE; these are edge target portions. About 30 target portions, including some edge target portions are exposed at a slower scan speed to minimize defects. These are denoted Cs and indicated by less dense hatching. The slower scan speed can be about 50% of the scan speed at which other target portions Cf are exposed. It can therefore be seen that performing exposures at a slower scan speed to reduce formation of defects can cause a significant reduction in throughput.

However, a significant cause of defects is the generation of bubbles when the substrate edge WE crosses the meniscus 17 at a position such that the substrate edge WE and the leading edge of the meniscus 17 are substantially parallel. The leading edge of the meniscus 17 is the edge of the meniscus 17 which will first be met by a part of the substrate W or substrate table WT moving under the liquid confinement structure 12. If the immersion space 10 has a cornered shape and the substrate table WT is moving in a direction such that the corner is leading, both edges that meet at the corner can be considered leading edges. The positions at which the substrate edge is substantially parallel to the meniscus 17 will depend on the shape of the meniscus. Since the substrate edge and, potentially, also the meniscus are curved, the substrate edge and the meniscus cannot be mathematically exactly parallel. In this document, when it is stated that the substrate edge and the meniscus are substantially parallel it should be understood that the respective tangents to the substrate edge and the meniscus 17 at the point of crossing are substantially parallel.

In an embodiment, the liquid confinement structure 12 is configured to confine the immersion liquid to an immersion space 10 which has a cornered shape in plan, i.e. substantially parallel to the facing surface. The meniscus 17 has the cornered shape. The cornered shape may be, for example, generally diamond-shaped with rounded corners. The sides may be slightly concave. The corners point in the scan (Y) and non-scan (X) directions so that the principal axes of the cornered shape are substantially orthogonal and respectively substantially parallel to the scan and non-scan directions. The major movements of the substrate table WT are in the scan and non-scan directions.

When the meniscus 17 has the cornered shape as described above, if the substrate edge WE crosses the meniscus 17 at a position where the tangent to the substrate edge WE is at an angle of about 45°, the meniscus 17 will be substantially parallel to the substrate edge WE when the meniscus and substrate edge cross. If the substrate W is regarded as a clock face with 12 o'clock at the +Y position, the meniscus 17 will be generally parallel to the substrate edge WE if they cross at positions between about 1 and 2, about 4 and 5, about 7 and 8 or about 10 and 11.

According to an embodiment, the exposure route is configured so that the entry motion is not performed in line with and directly before the exposure motion. Rather a transfer motion is performed between the entry motion and the exposure motion. In the entry motion, the substrate table moves from an off-substrate position at which the immersion space does not overlap the substrate to an on-substrate position at which the immersion space at least partially overlaps the substrate. The transfer motion takes at least a certain (e.g., predetermined) transfer time after the time at which the substrate edge WE crosses the edge of the immersion space 10 and desirably involves moving the substrate table WT at least a certain (e.g., predetermined) distance. The substrate W is not exposed during the entry motion and transfer motion. In other words, the patterned beam is not projected onto the substrate W at an intensity sufficient to expose the radiation-sensitive layer.

An embodiment of the route can reduce the formation of defects through one or more of the following mechanisms:

The transfer time can be selected to allow any bubbles that might be generated during the entry motion to dissolve in the immersion liquid.

The transfer time can be selected to allow any bubbles that might be generated during the entry motion to be removed through circulation of the immersion liquid in the immersion space.

The transfer motion allows the position at which the entry motion is performed to be selected such that the meniscus is not parallel to the substrate edge so that the generation of bubbles in the entry motion is not reduced.

In an embodiment, the substrate table WT is not stationary relative to the immersion space 10 during the transfer motion. Some resists are degraded by extended contact with the immersion liquid and so by moving the substrate table WT during the transfer motion it can help ensure that degradation of the resist does not occur or occurs within acceptable limits.

In an embodiment, the transfer motion includes a change of direction of movement of the substrate table WT. The change of direction of movement provides flexibility in selection of the entry point and direction of movement in the entry motion and can assist in dissipation of bubbles that might exist in the immersion liquid.

In an embodiment, the transfer motion includes an S-shaped motion. The S-shaped motion enables the transfer motion to be optimized to reduce or minimize any loss of throughput.

In an embodiment, the transfer time is at least 50 ms, desirably at least 100 ms. A delay of this amount of time can allow any bubble that might exist in the immersion liquid to dissolve or be removed through circulation of the immersion liquid.

In an embodiment, a plurality of target portions are exposed during respective exposed motions and all target portions are exposed without ever fully removing the substrate W from underneath the immersion space 10. This helps ensure that there is always overlap between immersion liquid and the substrate W and therefore there is no need for multiple entry motions. Having only a single entry motion reduces or minimizes the occasions on which there is a significant probability of generation of bubbles.

Figure 6:
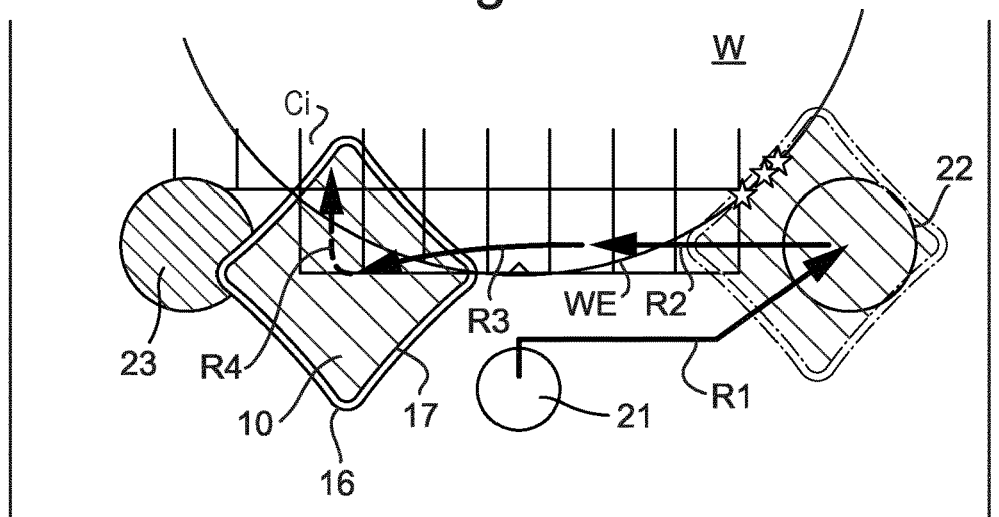
FIG. 6 schematically depicts an exposure route according to an embodiment of the invention.

FIG. 6 depicts the beginning parts of an exposure route according to an embodiment. In FIG. 6, solid-headed arrows depict relative movements between the substrate table WT and immersion space 10 defined by the liquid confinement structure 12. For simplicity of depiction, the movements are shown as if the liquid confinement structure 12 moves over a stationary substrate table WT but in reality the substrate table WT typically moves underneath a stationary liquid confinement structure 12. Movements below are described in terms of X and Y axes, where Y corresponds to the scan direction, purely for ease of description. In the drawings, the +Y direction is up the page, the +X direction is rightwards. In FIG. 6, a part of the substrate W is shown overlaid with a grid of target portions to be exposed. The planned exposure route calls for target portion Ci to be exposed first.

Figure 5:
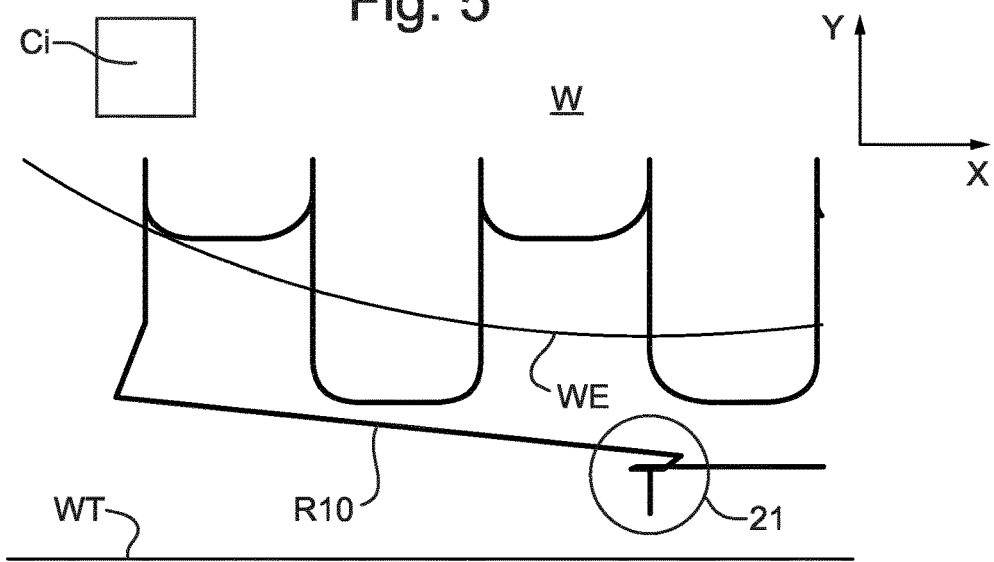
FIG. 5 schematically depicts a part of a conventional exposure route.

Before exposing any target portions, the substrate table WT is positioned so that a sensor 21, e.g. an energy sensor or calibration sensor, is positioned underneath the projection beam. Various measurements of the projection beam may be performed, e.g. to calibrate an energy sensor provided in the illuminator relative to the intensity of the projection beam at substrate level. A conventional exposure route, depicted as route R10 in FIG. 5, moves the substrate table in the +X direction (equivalent to the liquid confinement structure 12 moving in the −X direction) in order to line up the substrate for a straight line movement to expose target portion Ci. Although such a movement would minimize the time spent prior to the first exposure, as discussed above, this could present a high risk of defects.

Therefore, in an embodiment, the substrate table WT follows an exposure route that initially moves in the X direction (equivalent to liquid confinement structure moving in the +X direction) as indicated by R1 in FIG. 6. This, for example, takes a reference module 22 near the immersion space 10. Reference module 22 also includes a sensor so that measurements may be performed if desired. Reference module 22 may, for example, comprise a transmission image sensor (TIS) and a fiducial which are used to establish the relative positions of the substrate W and patterning device MA. A sensor or reference module 23 (and/or sensor/reference module 25 and/or sensor/reference module 24 (see FIG. 12)) is provided on another part of the substrate table WT. The substrate table WT is then moved in the +X direction to perform entry motion R2 so that the crossing of the substrate edge WE and the meniscus 17 occurs at a position remote from the first target portion Ci. As indicated by the stars, there is a possibility of generation of bubbles at the entry point. At this position, the substrate edge WE is nearly parallel to the leading edge of the immersion space 10. However, a transfer motion R3, R4 during which the substrate table WT moves to line up the substrate W for exposure of target portion Ci allows time for any bubbles generated during the entry motion R2 to dissolve or be removed. The second part of transfer motion R4 includes a change of direction of movement to line up for the exposure motion over target portion Ci. A controller 500 is configured to control the second positioning device PW to drive the substrate table WT to follow the exposure route.

Although the exposure route depicted in FIG. 6 takes more time than a direct movement from the sensor 21 to line up to expose target portion Ci, the reduced probability of bubbles remaining in the immersion liquid when target portion Ci is exposed allows the target portion Ci and subsequent target portions to be exposed at a higher scan speed without an increase in probability of defects. The time gain through increased scan speed can more than compensate for the time loss through the increase in total length of the exposure route.

Figure 7:
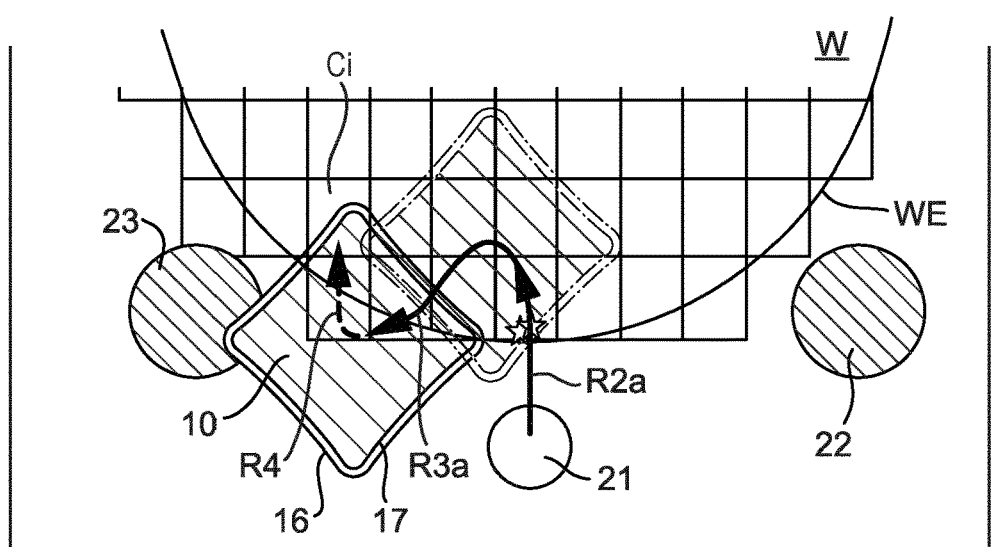
FIG. 7 schematically depicts another exposure route according to an embodiment of the invention.

FIG. 7 depicts the beginning parts of an exposure route according to a further embodiment. The controller 500 is configured to control the second positioning device PW to drive the substrate table WT to follow the exposure route. Again, the exposure route begins with sensor 21 positioned underneath the liquid confinement structure 12 to allow for measurements of the projection beam to be taken. The substrate table WT then moves in the −Y direction so that the substrate W moves under the liquid confinement structure 12, as indicated by R2*a*. The meniscus 17 therefore crosses the substrate edge WE at a position where the tangent to the substrate edge WE is substantially parallel to the X axis. Since the substrate table WT is moving in the −Y direction, a corner of the immersion space 10 is encountered first by the substrate edge WE. Therefore both of the two edges of the immersion space that meet at the leading corner can be considered leading edges. Both of these edges are at an angle of about 45° to the tangent to the substrate edge WE. Therefore, the generation of bubbles when the meniscus 17 crosses the substrate edge WE is reduced or minimized. The substrate table WT then performs a substantially S-shaped movement R3*a*, R4 in order to line up for exposure of initial target portion Ci.

Compared to the exposure route of FIG. 6, the exposure route of FIG. 7 has a shorter transfer motion between the entry motion and the expose motion. However, the position of the entry motion is selected to reduce or minimize the generation of bubbles. Hence the generation of defects in the exposures can still be suppressed. The exposure route of FIG. 7 can involve a shorter delay before exposures begin than the exposure route of FIG. 6. It is still possible to expose all target portions at a higher scan speed hence a gain of throughput can be achieved.

Figure 8:
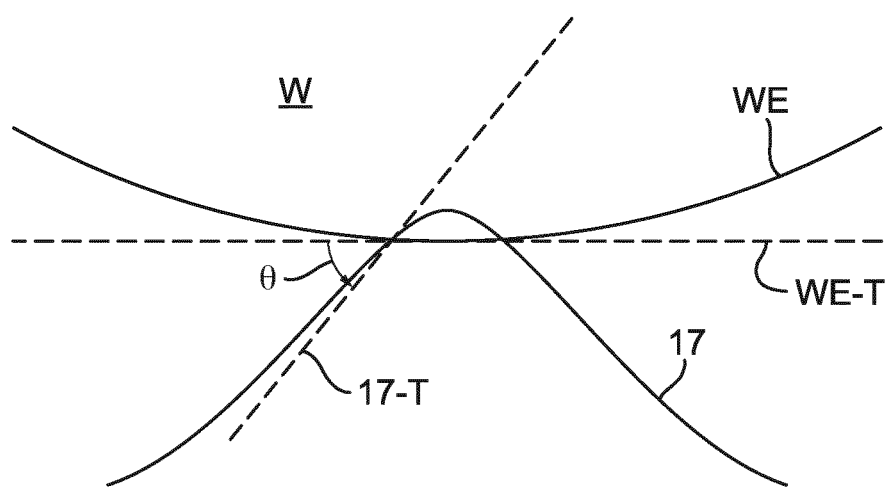
FIG. 8 schematically depicts a meniscus crossing a substrate edge.

FIG. 8 indicates how the angle between the substrate edge WE and meniscus 17 can be determined. The angle $\theta$ is taken between a tangent WE-T to the substrate edge WE at the position where the meniscus 17 first intersects the substrate W and a tangent 17-T to the, or each, leading edge of the meniscus 17. It is believed that values of angle $\theta$ greater than or equal to 20° or greater than or equal to 30° reduce or minimize the generation of bubbles. Desirably angle $\theta$ is less than about 70° or less than about 60° to avoid that bubbles are instead generated elsewhere.

Figure 9:
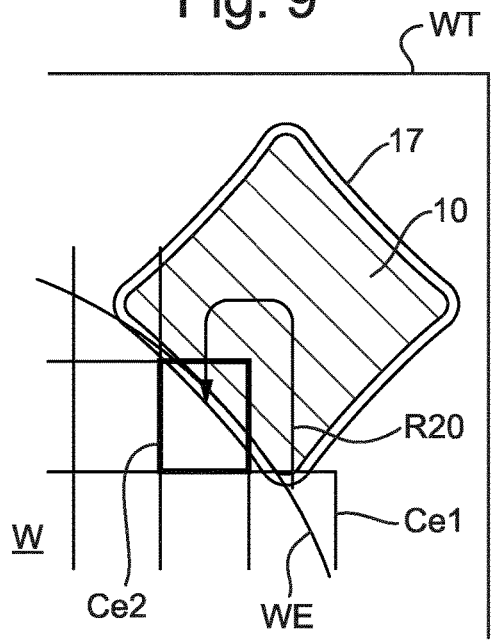
FIG. 9 schematically depicts a part of an exposure route in which the substrate moves out from underneath the immersion liquid.

FIG. 9 depicts a later part of a conventional exposure route. Having exposed an edge target portion Ce1 the substrate table WT performs a turnaround motion R20 to position itself to expose another edge target portion Ce2. During the turnaround motion R20, the substrate table moves so that the substrate is completely removed from underneath the immersion space 10. Therefore, the substrate edge WE again crosses the meniscus 17 and does so at a position where the substrate edge WE is nearly parallel to a leading edge of the meniscus 17. Therefore there is a significant probability of bubbles being generated.

Figure 10:
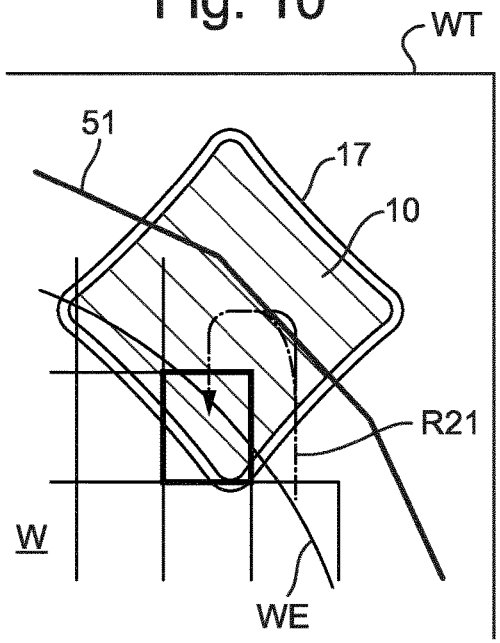
FIG. 10 schematically depicts a part of an exposure route where the movement of the substrate table is constrained so that part of the immersion liquid continuously overlaps the substrate.

FIG. 10 shows a modified turnaround motion R21, indicated in the figure by dot-chain line, in which it is avoided that the substrate W moves wholly out from underneath the immersion space 10 during the modified turnaround motion. The modified turnaround motion R21 ensures that a part of the substrate W always partially overlaps the immersion space 10 during the turnaround motion. A suitable modified turnaround R21 can be calculated in a routing program by imposing a constraint on the range of allowed movements of the substrate table. The constraint can be a polygon 51 surrounding the substrate position.

Figure 11:
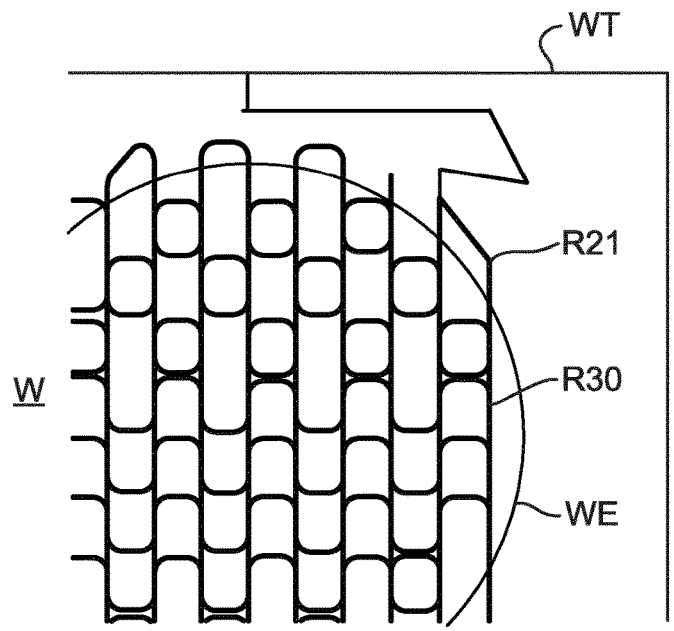
FIG. 11 schematically depicts an exposure route according to a further embodiment of the invention.

FIG. 11 illustrates another modified turnaround motion R21 in which the substrate table makes a turn and then a straight diagonal motion rather than a curved motion as shown in FIG. 10. FIG. 11 also shows the exposure route R30 for exposing a plurality of target portions.

Figure 12:
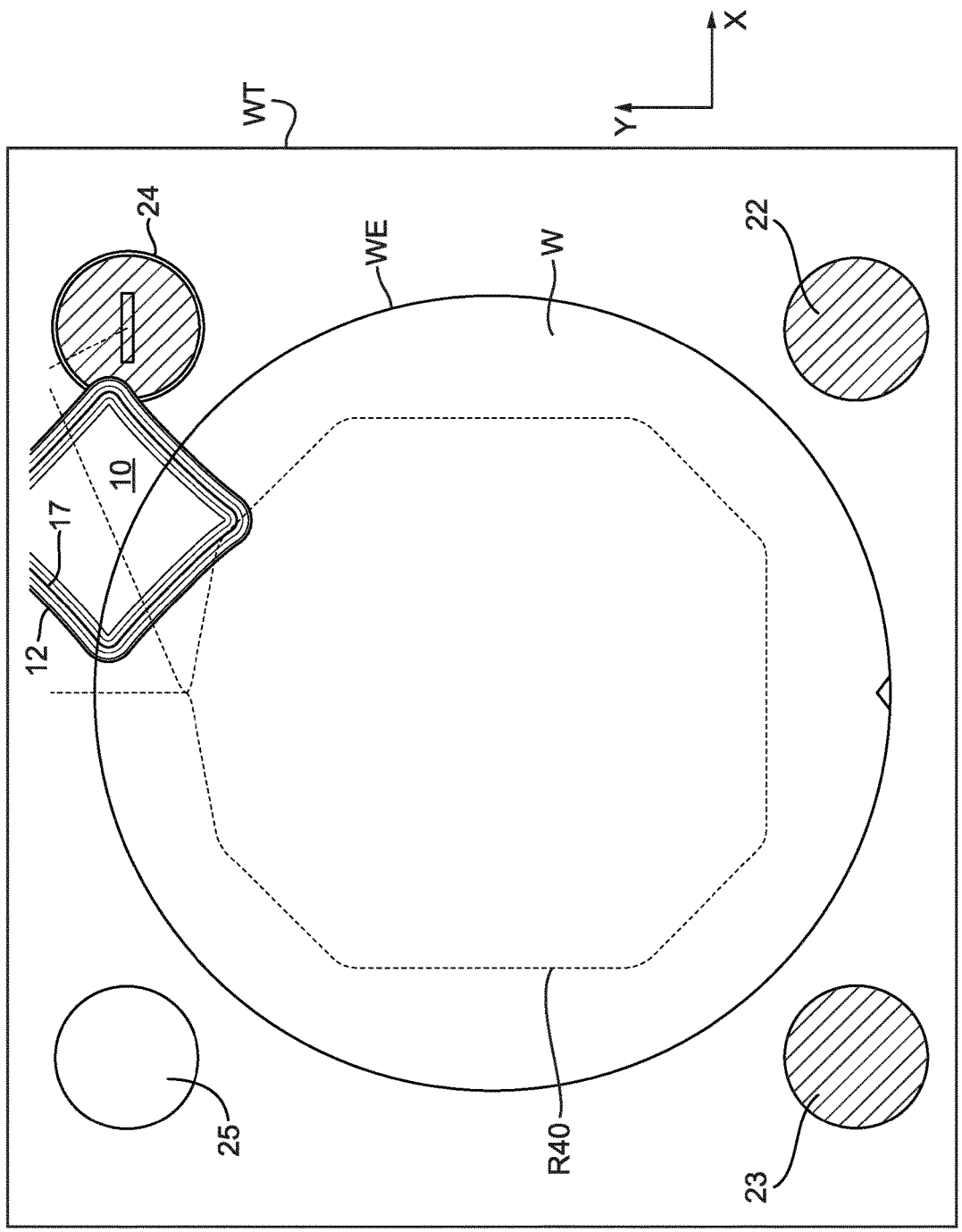
FIG. 12 schematically depicts a clean-up motion after exposure of all target portions of the substrate.

As mentioned above, so-called trail defects occur due to droplets of immersion liquid that are left on the substrate. The presence of the droplets can degrade the resist. If the droplet evaporates, a residue can be left behind. Trail defects are not uniformly distributed over the area of the substrate. A substantial proportion of trail defects can occur in an approximately annular region of the substrate adjacent the substrate edge. It is proposed that a post-exposure sweep motion be performed after exposure of all target portions of a substrate. The post-exposure sweep motion is shown in FIG. 12. The post-exposure sweep motion R40, indicated by a dashed line, involves moving the substrate table WT so that a polygonal locus on the substrate W is moved under the center of the immersion space 10. The polygonal locus may have 6 or more sides, e.g. 9, and may be regular or non-regular. A circular locus can be used instead. The locus is centered on the center of the substrate W. The post-exposure sweep motion is performed at a speed slow enough to help ensure no liquid loss but otherwise as fast as possible to reduce or minimize any reduction in throughput. Other post-exposure sweep motions that can be used are disclosed in United States patent application publication no. US 2009-0066922.

How the post-exposure sweep motion deals with droplets depends on the type of liquid confinement structure used. In some cases droplets on the substrate W will merge into the immersion liquid confined to the immersion space. In other cases, e.g. where a gas seal is used to confine the immersion liquid to the immersion space, a "bulldozer" effect occurs and the droplets are swept up and pushed along in front of the leading edges of the liquid confinement structure 12. In such a case, the post-exposure sweep motion is configured to push the accumulated droplets off the edge of the substrate W. It is possible to perform more than one post-exposure sweep motion.

The above described clean-up move is effective to reduce trail defects, but trail defects sometimes still occur in certain locations. The trail defects may be caused by droplets left on the substrate W during a series of exposures, even though a post-exposure sweep motion is performed. In some cases, sufficient degradation of the resist to cause a defect may occur in the short time between a droplet being left on the substrate W and the post-exposure sweep motion.

According to an embodiment, during a series of exposures, the substrate table WT follows an exposure route including a first motion in a first direction followed by a second motion in a second direction, substantially orthogonal to the first direction. The first motion can be an expose motion and the second motion a transfer motion or vice-versa. Between the first motion and the second motion, a cleaning motion is performed in which the substrate table WT continues towards the substrate edge WE far enough that the substrate edge WE passes under a leading edge of the liquid confinement structure 12. The cleaning motion helps ensure that any accumulation of droplets being pushed along by the leading edges of the liquid confinement structure 12 (e.g. by the bulldozer effect mentioned above) are pushed off the substrate W. Therefore resist degradation is avoided. The additional time taken for the cleaning motion can have a detrimental effect on throughput, but only needs to be performed in certain places so that the throughput loss is more than made up for by a reduction of defects. A return motion is performed to put the substrate table WT back in the position it would have been had the cleaning motion not been performed. The controller 500 is configured to control the second positioning device PW to drive the substrate table WT to follow the exposure route.

Figure 13:
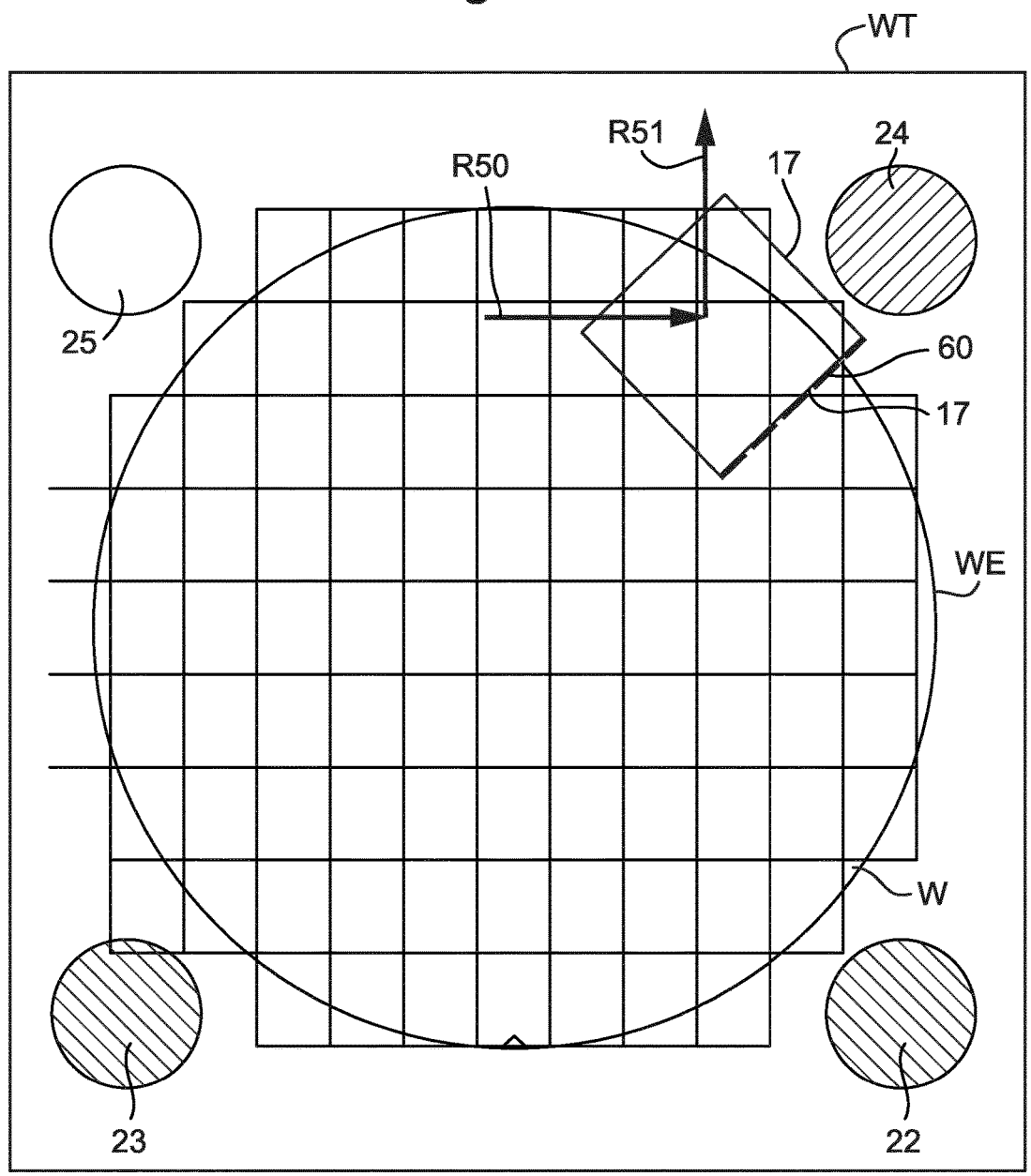
FIG. 13 schematically depicts a part of an exposure route in which debris can be left on the substrate.
Figure 14:
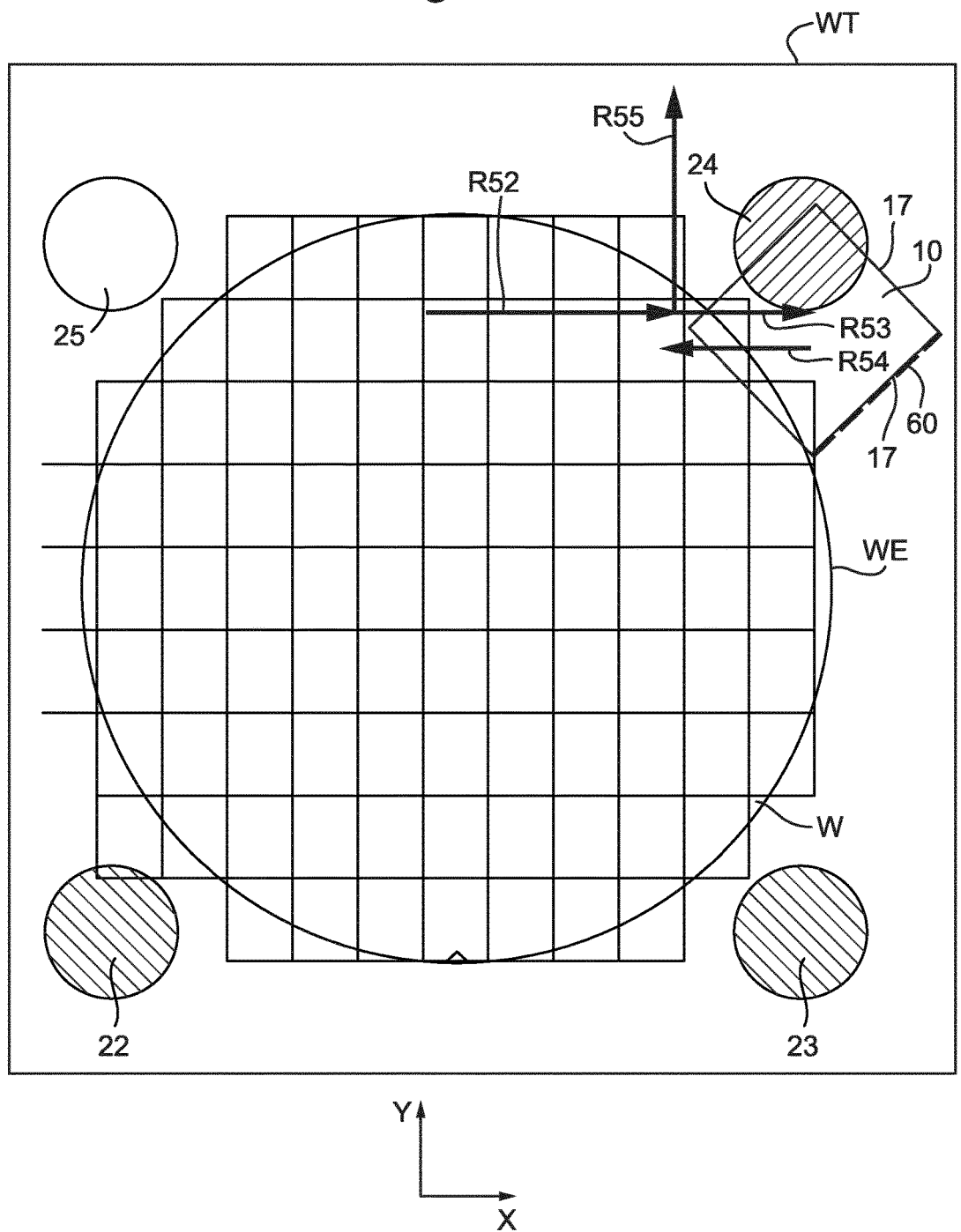
FIG. 14 schematically depicts a part of an exposure route according to an embodiment of the invention including a cleaning movement between exposures of the target portion.

An advantage of the cleaning motion can be seen from FIGS. 13 and 14. FIG. 13 depicts a part of an exposure route without a cleaning motion. The substrate table WT makes a first motion R50 in the −X direction, e.g. a transfer motion. It then makes a second motion R51 in the −Y direction, e.g. to expose a target portion. When the substrate table WT changes direction, any droplets 60 that were being pushed along by the leading edge of the liquid confinement structure (e.g. by the bulldozer effect mentioned above) will be left behind on the substrate W. The droplets 60 left behind may cause degradation of the resist.

FIG. 14 depicts a part of an exposure route with a cleaning motion. The substrate table WT makes a first motion R52 in the −X direction, e.g. a transfer motion. It then makes a cleaning motion R53 which continues in a third direction, e.g. the −X direction, until substrate edge WE has passed under the leading edge of the liquid confinement structure 12. The accumulated droplets 60 will now have been pushed off the substrate W and can be removed, e.g. via a drain (not shown in the figure) in the substrate table WT. The substrate table then makes a return motion R54 in a fourth direction, e.g. the +X direction before the second motion R55 in the −Y direction, e.g. to expose a target portion.

The cleaning motion and/or the return motion need not be exactly in line with the first motion. A different direction can be chosen, for example, to reach the edge of the substrate W more quickly and/or to more effectively to sweep up droplets. The directions of, and distances covered by, the cleaning motion and/or the return motion can be chosen to better position the substrate table WT for the next motion to be performed.

It is desirable that, during the cleaning motion and the return motion, the substrate W does not move completely out from under the immersion space 10. In other words, throughout the cleaning motion and the return motion, a part of the substrate overlaps the immersion space 10. By ensuring a continuous overlap, it is possible to avoid extra entry movements which might be sources of bubble generation. An inner edge of the immersion space 10, i.e. an edge of the immersion space 10 closest to the center of the substrate W, remains on the substrate W while an outer edge of the immersion space 10, i.e. an edge of the immersion space 10 distant from the center of the substrate W, pushes droplets off the substrate W.

As mentioned above, locations on a given exposure route of a substrate W at which there is a risk of immersion liquid being lost from the immersion space 10 can be predicted. It has been conventional practice to slow the movement of the substrate W during exposure of the relevant target portions in order to reduce the risk of loss of immersion liquid, however this reduces throughput. It is therefore proposed to add additional cleaning movements to the exposure route in order to remove the liquid left on the substrate W. This is described further with reference to FIGS. 15 to 19. Additional cleaning moves as described below can be used as an alternative to or in addition to changes in scanning speed.

According to an embodiment of the invention, a substrate layout, defining the locations and sizes of target portions to be exposed, and a desired order of exposures of the target portions are specified by the user. An initial exposure route is calculated to perform the exposures at maximum throughput. The initial exposure route may take into account other parameters of the exposure recipe, for example the nature of the photo-sensitive layer and/or any top coat applied.

Next, the initial exposure route is analyzed to predict locations on the substrate W at which there is a risk of immersion liquid being lost from the immersion space 10. Where liquid might be lost will depend on the shape and structure of the liquid confinement structure 12, scanning speed and other recipe-specific factors such as the nature of the photo-sensitive layer and/or any top coat. The prediction of the locations where there is a risk of loss of immersion liquid may be carried out on the basis of theoretical rules, empirical rules, statistics or any combination of these techniques.

Figure 15:
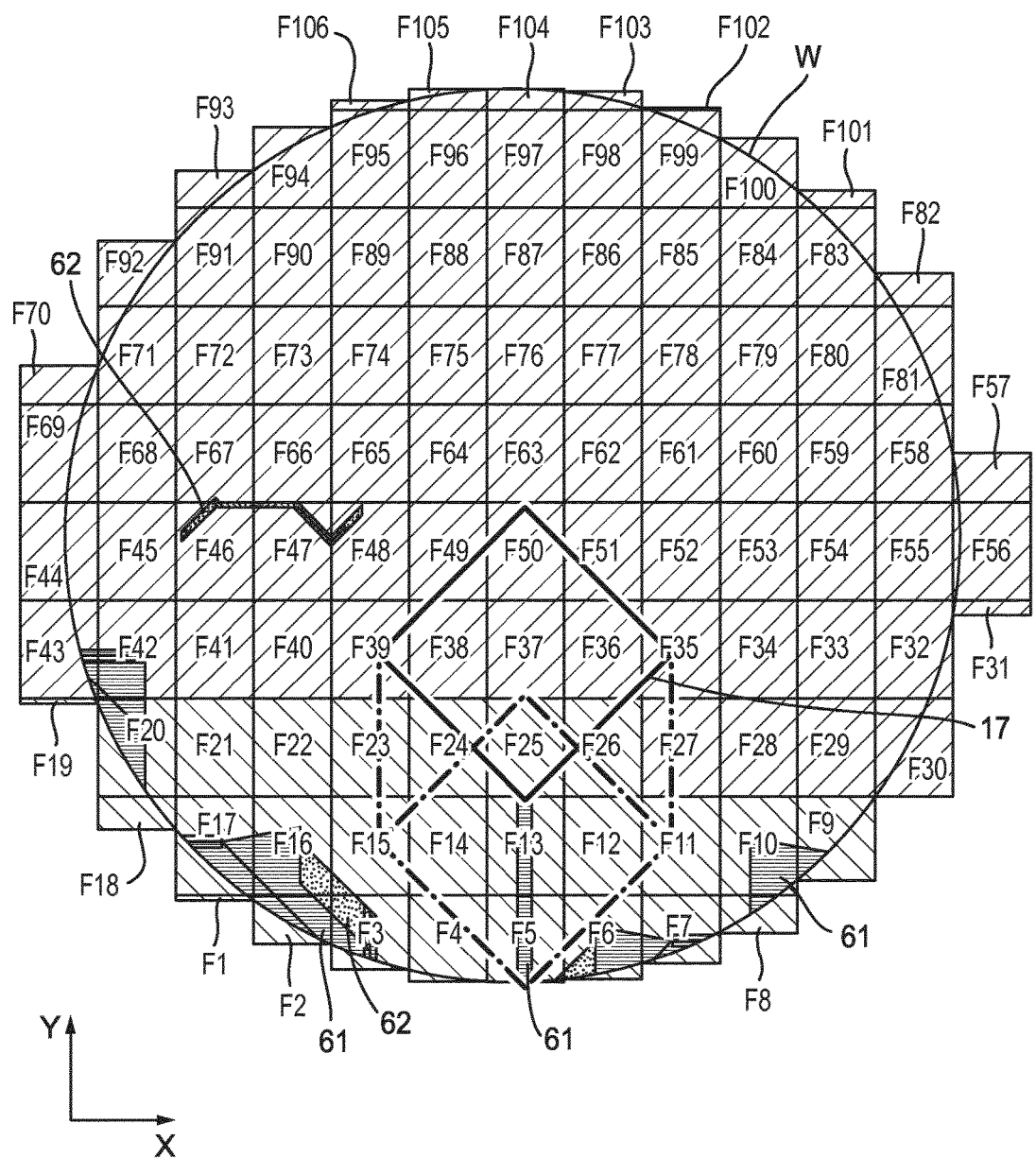
FIGS. 15 to 17 depict a part of an exposure sequence described for reference purposes.

FIG. 15 shows an example of the results of such an analysis carried out for a substrate W having 106 target portions F1 to F106, including target portions that overlap the edge of the substrate W, that are exposed in that order. In FIG. 15, areas 61 have a risk of immersion liquid being lost are indicated by horizontal hatching. Areas 62, indicated by dotted fill, are areas where lost immersion liquid might be moved as a result of subsequent movements of the substrate W, i.e. movements of the substrate W relative to the immersion space 10 after the immersion liquid was first lost onto the substrate W.

FIG. 15 also shows, by way of example, the relative movement between the meniscus 17 and the substrate W in the course of exposure of target portion F25. At the starting position, indicated by the dot-chain outline, a trailing corner of the meniscus 17 overlaps the edge of the substrate W. When the substrate W moves so that this corner moves onto the substrate W, immersion liquid might be lost from the immersion space 10, leaving a trail of liquid across target portions F5 and F13 until the substrate movement in the −Y direction halts with the meniscus 17 at the position shown by the solid outline.

Figure 16:
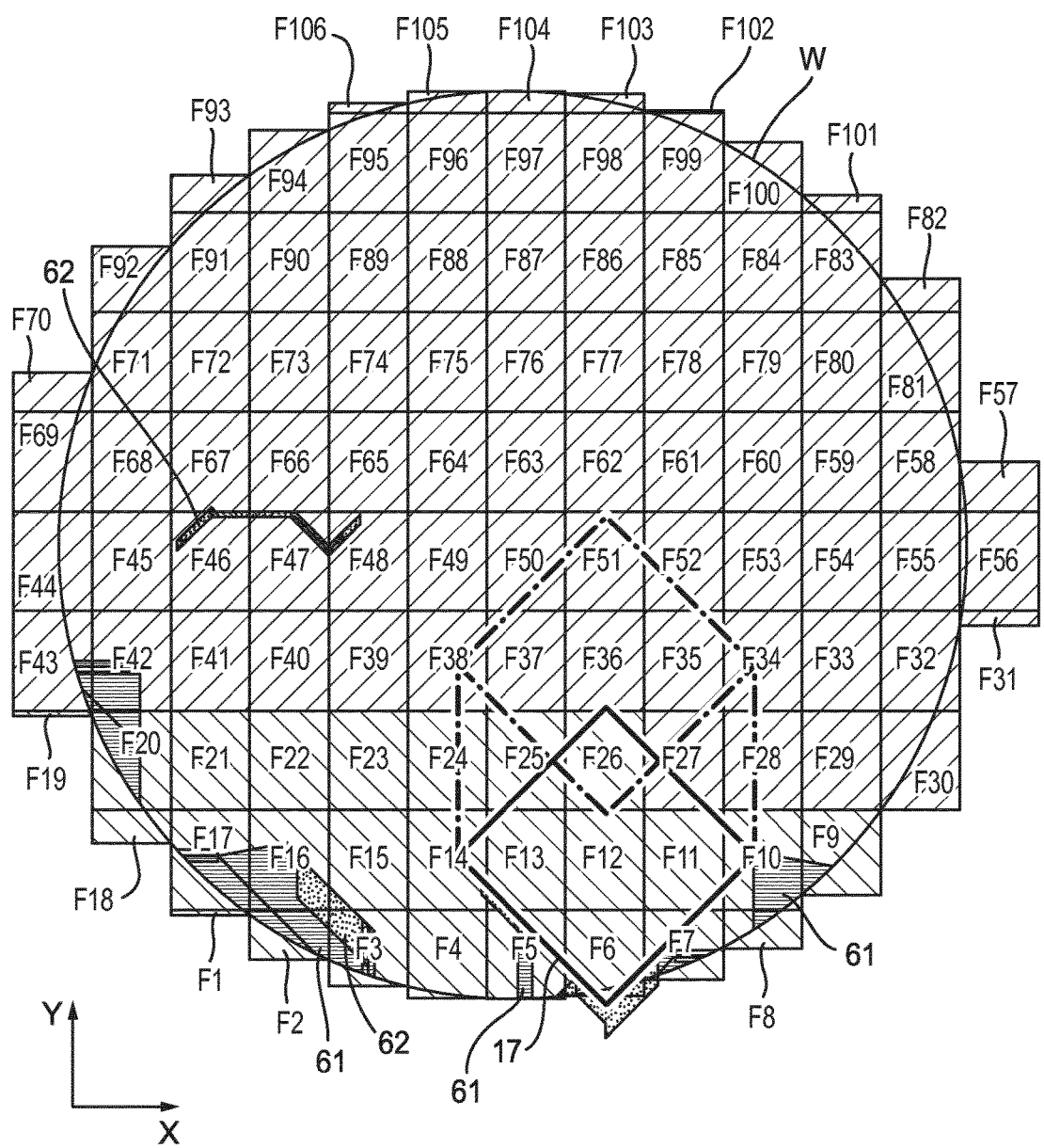
Figure 17:
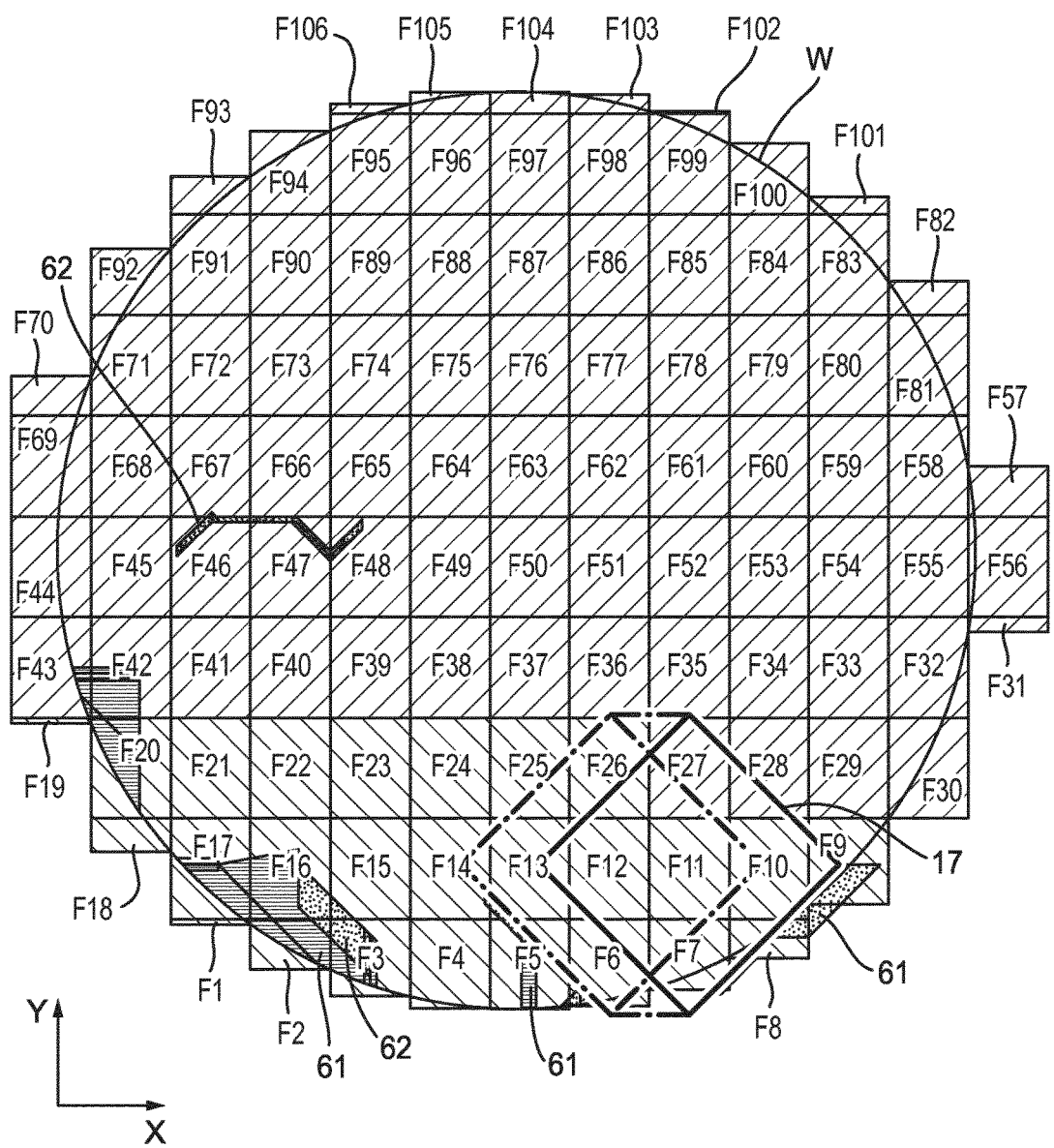

FIGS. 16 and 17 show the effect of subsequent movement back in the +Y direction to expose target portion F26 followed by a movement in the −Y direction preparatory to exposure of target portion F27. It can be seen that the original trail of immersion liquid left on target portion F13 is pushed aside and mostly ends up in an area spanning target portions F5, F13 and F14.

In a method, the scanned exposures of certain target portions and the intervening movements of the substrate W are performed at a lower speed than the scanned exposures of other target portions in order to reduce the risk of loss of immersion liquid from the immersion space 10. In the example of FIGS. 15 to 19 the target portions scanned at a lower speed are F1 to F26 which are indicated by different hatching than the remaining target portions. So long as the reduction in scanning speed does not wholly eliminate the risk of loss of immersion liquid, the teachings of an embodiment of the present invention can be applied. The teachings of an embodiment of the present invention can allow scanning at a higher speed. A user can strike a balance between exposing faster, hence increasing the risk of loss of immersion liquid, and introducing more cleaning moves to increase or maximize throughput.

Having predicted the locations at which there is a risk of immersion liquid being left on the substrate W, the next step, in an embodiment, is to generate additional cleaning moves to remove any immersion liquid that is left behind on the substrate W. In an embodiment, a cleaning move removes immersion liquid from the substrate W by pushing it off the edge of the substrate W. Such a cleaning move can be referred to as a bulldozing move. In an embodiment, a cleaning move uses an extraction device of the liquid confinement structure 12 to remove the immersion liquid. Such a cleaning move can be referred to as a mopping up move. In an embodiment, a combination of one or more bulldozing moves and one or more mopping up moves are performed. A user can set a threshold of the probability of liquid loss and/or of the likely amount of liquid loss, above which a cleaning move is provided.

The immersion liquid left on the substrate W might cause defects in the manufactured device because of physical and/or chemical interactions between any combination selected from: the immersion liquid, the photo-sensitive layer, any top coat and/or the local atmosphere. Such interactions can occur in a timescale of a few seconds. In an embodiment, one or more cleaning moves are performed as soon as possible after the movement that gives rise to the risk of loss of immersion liquid. In this way the amount of time within which an undesirable interaction can take place is reduced or minimized.

Figure 18:
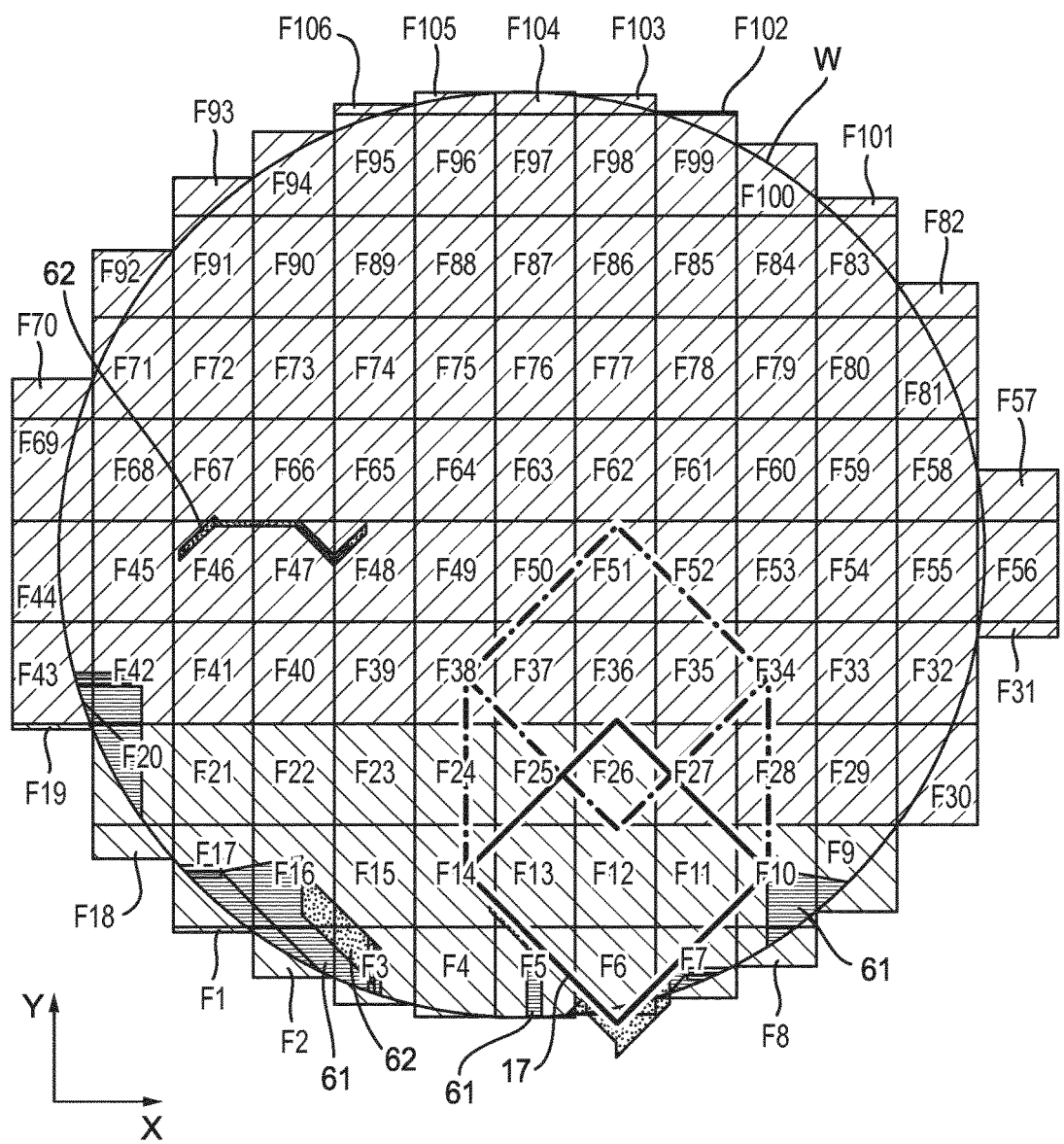
FIGS. 18 and 19 depict a part of an exposure sequence including cleaning moves according to an embodiment of the invention.
Figure 19:
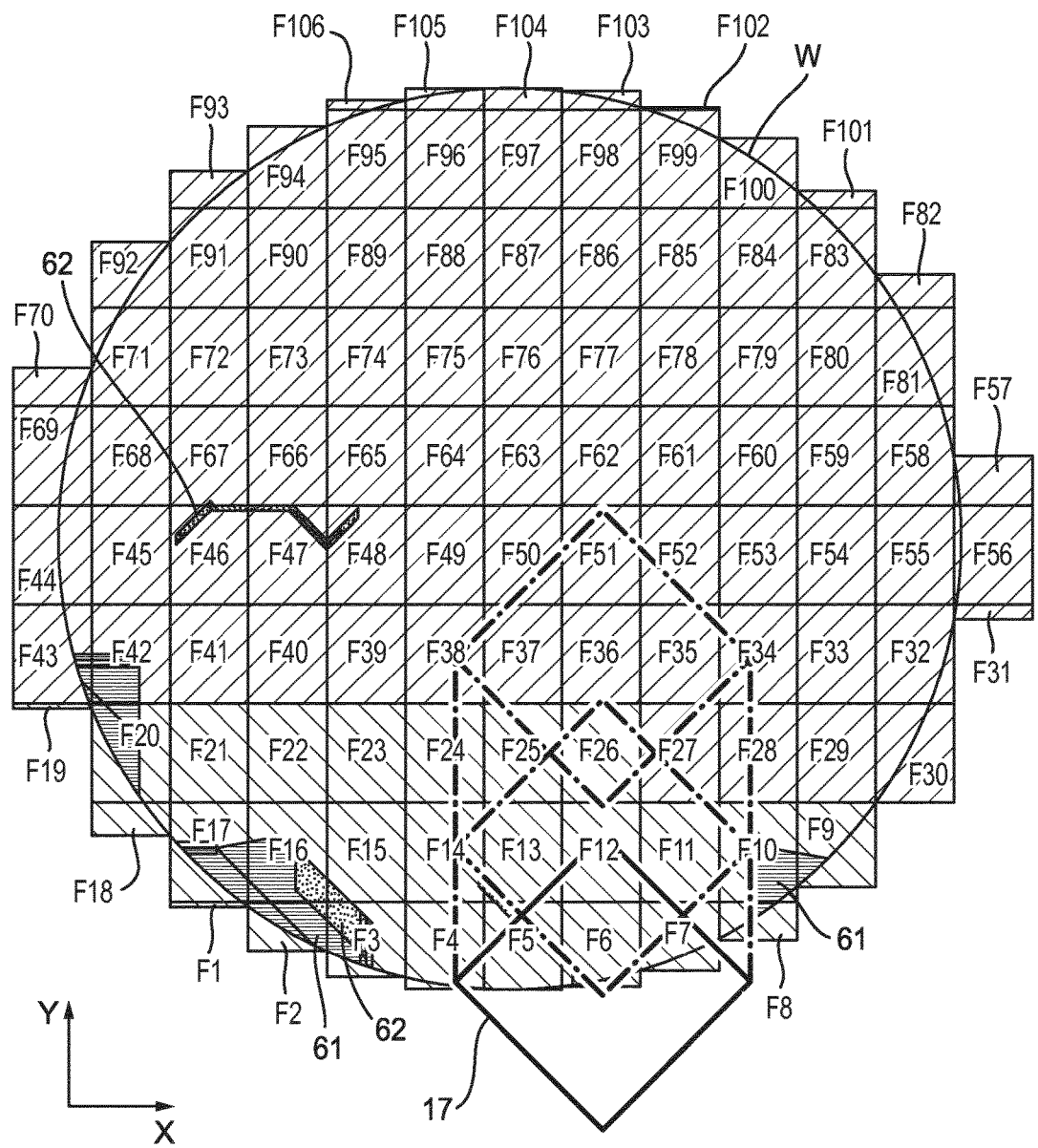

An example of a cleaning move is illustrated in FIGS. 18 and 19. In the situation depicted in FIG. 18, the exposure of target portion F26 has just been completed and immersion liquid lost onto the substrate W during exposure of target portion F25 has partly been bulldozed but remains on the substrate W. Rather than move in the X direction to position for exposure of target portion F27, in an embodiment, the movement in the +Y direction is continued until the immersion liquid is pushed off the edge of the substrate W, as shown in FIG. 19.

The additional cleaning moves generated in an embodiment of the invention are combined with the original routing instructions to generate modified routing instructions and executed by the lithography apparatus to expose the substrate W.

In addition to or as an alternative to the use of extra cleaning moves and slowing down scans of certain target portions, an embodiment of the invention automatically considers reversing the scan direction for some or all target portions. The choice of direction of scan for a target portion is conventionally made on the basis of throughput considerations. Once the choice of direction for the first target portion is made, e.g. by the user, the direction of scan for all the other target portions is dictated by the alternating meander pattern which minimizes the time taken by turn around moves between exposure scans. However, the probability of liquid loss can be dependent on the scan direction.

An embodiment of the invention therefore simulates multiple routes involving different scan directions for target portions having a probability of liquid loss greater than a threshold. The multiple routes may comprise simply changing the scan direction of the first target portion and all subsequent ones, or changing the scan directions of individual target portions or sequences of target portions, e.g. rows of target portions. In some cases, changing the scan direction of some or all target portions will reduce throughput, e.g. because of the introduction of additional turn-around moves. However this might be balanced by a reduction in defects so that overall yield is increased. In other cases, changing the scan direction of some or all target portions will increase throughput, e.g. because the scanning of fewer target portions needs to be slowed down. In general the starting scan direction is selected which leads to least liquid loss. As a result, scanning of fewer target portions needs to be slowed down.

In an embodiment, a computer program computes an optimal set of routing instructions including any or all of: reduced speed scans, additional cleaning moves and/or scan direction changes, taking account of the probability of liquid loss to maximize yield.

The prediction of loss of immersion liquid, the generation of additional cleaning moves and the generation of modified routing instructions can be performed by a control system or computer incorporated in the lithography apparatus or by one or more separate computers. These steps of the method can be performed in advance of the production exposures or just in time during exposures. Modified routing instructions can be generated once and applied to a plurality of substrates that are to be exposed with the same recipe.

In an embodiment, instructions to calculate or perform the exposure routes may take the form of a computer program containing one or more sequences of machine-readable instructions describing a method as disclosed above, or a data storage medium (e.g. semiconductor memory, magnetic or optical disk) having such a computer program stored therein. The computer program can be applied as an upgrade to an existing lithography apparatus.

In an embodiment, there is provided an immersion lithography apparatus comprising: a substrate table configured to support a substrate having a plurality of target portions; a projection system configured to project a patterned beam onto the substrate; a positioner configured to move the substrate table relative to the projection system; a liquid confinement structure configured to confine a liquid to an immersion space between the projection system and a surface of the substrate and/or the substrate table; and a controller configured to control the positioner to move the substrate table to follow an exposure route, the exposure route comprising in order: an entry motion in which the substrate table moves from an off-substrate position at which the immersion space does not overlap the substrate to an on-substrate position at which the immersion space at least partially overlaps the substrate, a transfer motion in which the substrate table changes speed and/or direction and moves for at least a certain transfer time after the substrate moves to the on-substrate position, and an expose motion in which the substrate is scanned and the patterned beam is projected onto the substrate, wherein the patterned beam is not projected onto the substrate during the entry motion and the transfer motion, and wherein throughout the transfer motion at least a part of the immersion space overlaps the substrate.

In an embodiment, the entry motion occurs at a position on the substrate selected such that a tangent to the edge of the substrate at that position is at an acute angle to a leading edge of the immersion space. In an embodiment, the entry motion occurs at a position on the substrate selected such that an angle between the tangent to the edge of the substrate and the leading edge of the immersion space is in a range of from 20° to 70°, desirably 30° to 60°. In an embodiment, the transfer motion includes a change of direction of movement of the substrate table. In an embodiment, the transfer motion includes an S-shaped motion. In an embodiment, wherein the transfer time is at least 50 ms, desirably at least 100 ms. In an embodiment, the exposure route comprises a plurality of expose motions arranged to expose all target portions of the substrate and the exposure route is arranged so that throughout the exposure route after the entry motion at least a part of the immersion space overlaps the substrate.

In an embodiment, there is provided a device manufacturing method using an immersion lithography apparatus to project a patterned beam onto a substrate having a plurality of target portions, the method comprising: confining a liquid to an immersion space between a projection system and a facing surface; and moving a substrate table holding the substrate along an exposure route, the exposure route comprising in order: an entry motion in which the substrate moves from an off-substrate position at which the immersion space does not overlap the substrate to an on-substrate position at which the immersion space at least partially overlaps the substrate, a transfer motion in which the substrate table changes speed and/or direction and moves for at least a certain transfer time after the substrate moves to the on-substrate position, and an expose motion in which the substrate is scanned and the projection beam is projected onto the substrate, wherein the patterned beam is not projected onto the substrate during the entry motion and the transfer motion, and wherein throughout the transfer motion at least a part of the immersion space overlaps the substrate.

In an embodiment, the entry motion occurs at a position on the substrate selected such that a tangent to the edge of the substrate at that position is at an acute angle to a leading edge of the immersion space. In an embodiment, the entry motion occurs at a position on the substrate selected such that the angle between the tangent edge of the substrate and the leading edge of the immersion space is in a range of from 20° to 70°, desirably 30° to 60°. In an embodiment, the transfer motion includes a change of direction of movement of the substrate table. In an embodiment, the transfer motion includes an S-shaped motion. In an embodiment, the transfer time is at least 50 ms, desirably at least 100 ms. In an embodiment, the exposure route comprises a plurality of expose motions arranged to expose all target portions of the substrate and the exposure route is arranged so that throughout the exposure route after the entry motion at least a part of the immersion space overlaps the substrate.

In an embodiment, there is provided a device manufacturing method using an immersion lithography apparatus to project a patterned beam onto a substrate having a plurality of target portions, the method comprising: receiving routing instructions representing an order in which the target portions are to be exposed by projection of the patterned beam; predicting locations on the substrate at which there is a risk of liquid being left behind if the target portions are exposed according to the routing instructions; generating modified routing instructions including an additional movement to reduce the risk of liquid being left behind during exposure of the target portions; confining a liquid to an immersion space between a projection system and a facing surface using a liquid confinement structure; and moving a substrate table holding the substrate along an exposure route defined by the modified routing instructions.

Although specific reference may be made in this text to the use of lithography apparatus in the manufacture of ICs, it should be understood that the lithography apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive, reflective, magnetic, electromagnetic and electrostatic optical components.

While specific embodiments have been described above, it will be appreciated that embodiments of the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. An immersion lithography apparatus comprising:
    a substrate table configured to support a substrate having a plurality of target portions;
    a projection system configured to project a patterned beam onto the substrate;
    a positioner configured to move the substrate table relative to the projection system;
    a liquid confinement structure configured to confine a liquid to an immersion space between the projection system and a surface of the substrate and/or the substrate table; and
    a controller configured to control the positioner to move the substrate table to follow an exposure route, the exposure route comprising in order:
        an entry motion in which the substrate table moves from an off-substrate position at which the immersion space does not overlap the substrate to an on-substrate position at which the immersion space at least partially overlaps the substrate,
        a transfer motion, that is the next motion after the entry motion, in which the substrate table changes speed and/or direction and moves for at least a certain transfer time after the substrate moves to the on-substrate position, and
        an expose motion, that is the next motion after the transfer motion, in which the substrate is scanned and the patterned beam is projected onto the substrate,
        wherein the patterned beam is not projected onto the substrate during the entry motion and the transfer motion, and
        wherein throughout the transfer motion at least a part of the immersion space overlaps the substrate.

2. The apparatus according to claim 1, wherein the entry motion occurs at a position on the substrate selected such that a tangent to the edge of the substrate at that position is at an acute angle to a leading edge of the immersion space.

3. The apparatus according to claim 2, wherein the entry motion occurs at a position on the substrate selected such that an angle between the tangent to the edge of the substrate and the leading edge of the immersion space is in a range of from 20° to 70°.

4. The apparatus according to claim 1, wherein the transfer motion includes a change of direction of movement of the substrate table.

5. The apparatus according to claim 4, wherein the transfer motion includes an S-shaped motion.

6. The apparatus according to claim 1, wherein the transfer time is at least 50 ms.

7. The apparatus according to claim 1, wherein the exposure route comprises a plurality of expose motions arranged to expose all target portions of the substrate and the exposure route is arranged so that throughout the exposure route after the entry motion at least a part of the immersion space overlaps the substrate.

8. A device manufacturing method using an immersion lithography apparatus to project a patterned beam onto a substrate having a plurality of target portions, the method comprising:
    confining a liquid to an immersion space between a projection system and a facing surface; and
    moving a substrate table holding the substrate along an exposure route, the exposure route comprising in order:
        an entry motion in which the substrate moves from an off-substrate position at which the immersion space does not overlap the substrate to an on-substrate position at which the immersion space at least partially overlaps the substrate,
        a transfer motion, that is the next motion after the entry motion, in which the substrate table changes speed and/or direction and moves for at least a certain transfer time after the substrate moves to the on-substrate position, and
        an expose motion, that is the next motion after the transfer motion, in which the substrate is scanned and the projection beam is projected onto the substrate,
        wherein the patterned beam is not projected onto the substrate during the entry motion and the transfer motion, and
        wherein throughout the transfer motion at least a part of the immersion space overlaps the substrate.

9. The method according to claim 8, wherein the entry motion occurs at a position on the substrate selected such that a tangent to the edge of the substrate at that position is at an acute angle to a leading edge of the immersion space.

10. The method according to claim 9, wherein the entry motion occurs at a position on the substrate selected such that the angle between the tangent edge of the substrate and the leading edge of the immersion space is in a range of from 20° to 70°.

11. The method according to claim 8, wherein the transfer motion includes a change of direction of movement of the substrate table.

12. The method according to claim 11, wherein the transfer motion includes an S-shaped motion.

13. The method according to claim 8, wherein the transfer time is at least 50 ms.

14. The method according to claim 8, wherein the exposure route comprises a plurality of expose motions arranged to expose all target portions of the substrate and the exposure route is arranged so that throughout the exposure route after the entry motion at least a part of the immersion space overlaps the substrate.

15. A non-transitory computer readable medium having instructions therein, the instructions, when executed by a computer system, are configured to cause the computer system to at least:
    for an immersion space, having liquid therein, between a projection system of a lithographic apparatus and a substrate table of the lithographic apparatus, cause movement of the substrate table along an exposure route to project a patterned beam through the immersion space onto a plurality of target portions of a substrate, the exposure route comprising in order:
        an entry motion in which the substrate moves from an off-substrate position at which the immersion space does not overlap the substrate to an on-substrate position at which the immersion space at least partially overlaps the substrate, a transfer motion, that is the next motion after the entry motion, in which the substrate table changes speed and/or direction and moves for at least a certain transfer time after the substrate moves to the on-substrate position, and an expose motion, that is the next motion after the transfer motion, in which the substrate is scanned and the projection beam is projected onto the substrate, wherein the patterned beam is not projected onto the substrate during the entry motion and the transfer motion, and wherein throughout the transfer motion at least a part of the immersion space overlaps the substrate.

16. The computer readable medium according to claim 15, wherein the instructions are configured to cause the entry motion to occur at a position on the substrate selected such that a tangent to the edge of the substrate at that position is at an acute angle to a leading edge of the immersion space.

17. The computer readable medium according to claim 15, wherein the instructions are configured to cause the entry motion to occur at a position on the substrate selected such that the angle between the tangent edge of the substrate and the leading edge of the immersion space is in a range of from 20° to 70°.

18. The computer readable medium according to claim 15, wherein the transfer motion includes a change of direction of movement of the substrate table.

19. The computer readable medium according to claim 18, wherein the transfer motion includes an S-shaped motion.

20. The computer readable medium according to claim 15, wherein the instructions are configured to cause the exposure route to comprise a plurality of expose motions arranged to expose all target portions of the substrate, the exposure route is arranged so that throughout the exposure route after the entry motion at least a part of the immersion space overlaps the substrate.

* * * * *